US010620015B2

(12) United States Patent
Matsui et al.

(10) Patent No.: US 10,620,015 B2
(45) Date of Patent: Apr. 14, 2020

(54) MAGNETIC SENSOR DEVICE WITH HEAT DISSIPATER

(71) Applicant: Mitsubishi Electric Corporation, Chiyoda-ku (JP)

(72) Inventors: Hideki Matsui, Chiyoda-ku (JP); Tatsuya Kunieda, Chiyoda-ku (JP); Tomokazu Ogomi, Chiyoda-ku (JP); Masaaki Okada, Chiyoda-ku (JP); Sadaaki Yoshioka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/156,939

(22) Filed: Oct. 10, 2018

(65) Prior Publication Data
US 2019/0086237 A1 Mar. 21, 2019

Related U.S. Application Data

(63) Continuation of application No. 15/314,827, filed as application No. PCT/JP2015/067520 on Jun. 17, 2015, now abandoned.

(30) Foreign Application Priority Data

Jun. 18, 2014 (JP) .................. 2014-125159

(51) Int. Cl.
G01D 5/16 (2006.01)
G01R 33/09 (2006.01)
G01B 7/14 (2006.01)

(52) U.S. Cl.
CPC .............. G01D 5/16 (2013.01); G01B 7/14 (2013.01); G01R 33/09 (2013.01); G01R 33/091 (2013.01)

(58) Field of Classification Search
CPC ...... G01R 33/06; G01R 33/07; G01R 33/072; G01R 33/09; G01R 33/091; G01R 33/093;
(Continued)

(56) References Cited

U.S. PATENT DOCUMENTS 4,518,919 A    5/1985  Ishida
5,210,493 A *  5/1993  Schroeder .............. G01R 33/09
                                                  148/101
(Continued)

FOREIGN PATENT DOCUMENTS

CN      103842838 A     6/2014
DE   10 2013 016 433 A1  6/2014
(Continued)

OTHER PUBLICATIONS

English machine translation of the description of JP 2000039472, obtained from the EPO website, https://worldwide.espacenet.com/advancedSearch?locale=en_EP, obtained on Jun. 21, 2019.*

(Continued)

Primary Examiner — David M Schindler
(74) Attorney, Agent, or Firm — Oblon, McClelland, Maier & Neustadt, L.L.P.

(57) ABSTRACT

A magnetic sensor device includes: a magnetic circuit for forming a magnetic field, a magnetoresistance effect element, and a heat dissipater. The magnetoresistance effect element outputs changes in the magnetic field as changes in a resistance value, and is arranged on a surface (of a +Z side) of the magnetic circuit at a conveyance path side thereof. The heat dissipater is arranged in close contact with the magnetic circuit at the opposite side thereof (−Z side) from the conveyance path.

6 Claims, 24 Drawing Sheets

(58) Field of Classification Search
CPC .. G01R 33/095; G01R 33/096; G01R 33/098; G01R 33/0017; G01R 33/0052; G01B 7/14; G01B 7/30; G01D 5/16; G01D 5/142; G01D 5/145; G01F 7/04
See application file for complete search history.

(56) References Cited

U.S. PATENT DOCUMENTS

| | | | |
|---|---|---|---|
| 5,315,245 | A | 5/1994 | Schroeder |
| 8,253,210 | B2 * | 8/2012 | Theuss ................. B82Y 25/00 257/421 |
| 2006/0279280 | A1 | 12/2006 | Minamitani |
| 2011/0127998 | A1 * | 6/2011 | Elian ..................... B82Y 25/00 324/219 |
| 2013/0073238 | A1 | 3/2013 | Nomura |
| 2014/0028308 | A1 | 1/2014 | Ogomi et al. |
| 2015/0377650 | A1 * | 12/2015 | Asano ..................... G01D 5/16 324/207.21 |

FOREIGN PATENT DOCUMENTS

| | | |
|---|---|---|
| EP | 2 711 728 A1 | 3/2014 |
| JP | 58-7891 A | 1/1983 |
| JP | 8-201493 A | 8/1996 |
| JP | 2000-39472 A | 2/2000 |
| JP | 2012-255770 A | 12/2012 |

OTHER PUBLICATIONS

Combined Office Action and Search Report dated Jul. 30, 2018 in Chinese Patent Application No. 201580032668.7 with English translation of the Office Action and English translation of categories of cited documents therein, 19 pages.
Office Action dated Nov. 14, 2017 in German Patent Application No. 112015002893.5 (with English language translation).
Office Action dated Jan. 25, 2018 in German Patent Application No. 112015002893.5 (with English language translation).
International Search Report dated Sep. 15, 2015 in PCT/JP2015/067520 Filed Jun. 17, 2015.

* cited by examiner

MAGNETIC SENSOR DEVICE WITH HEAT DISSIPATER

CROSS REFERENCE TO RELATED APPLICATION

This application is a continuation of U.S. patent application Ser. No. 15/314,827, filed Nov. 29, 2016, which is a national phase application of PCT/JP2015/067520, filed Jun. 17, 2015, which claims priority to Japanese Patent No. 2014-125159, filed Jun. 18, 2014, the entire content and disclosure of each of which is incorporated by reference into the present application.

TECHNICAL FIELD

The present disclosure relates to a magnetic sensor device.

BACKGROUND ART

Patent Literature 1 discloses a magnetic sensor device that is equipped with a magnet and a magnetoresistance effect element for detection of an object to be detected that is conveyed through a conveyance path. A magnetic pole is disposed at one surface side of the magnet where the object to be detected is conveyed, and the magnet generates an intersection magnetic field that intersects the object to be detected. The magnetoresistance effect element is arranged between the magnet and the object to be detected. The magnetoresistance effect element has an output terminal and outputs as a change of resistance value a change of a conveyance direction component of the intersection magnetic field due to a magnetic component of the object to be detected conveyed through the intersection magnetic field. Further, Patent Literature 1 discloses, as a configuration of a magnetic circuit for generation of the intersection magnetic field, a configuration that disposes the object to be detected between opposing magnets, and a configuration that disposes a magnet at one surface of the object to be detected and disposes a magnetic body opposing another surface of the object to be detected.

Patent Literature 2 mentions a magnetic sensor that is characterized in that the magnetic sensor is equipped with a magnetoresistance element, a conductor layer and a resistance. The magnetoresistance element has an element board and pairs of magnetosensitive parts arranged parallel to one another at a fixed spacing on the element board. The conductor layer is disposed at a position equidistance with each of pairs of the magnetosensitive part. The resistance is connected electrically in series with the conductor layer.

CITATION LIST

Patent Literature

Patent Literature 1: Unexamined Japanese Patent Application Kokai Publication No. 2012-255770
Patent Literature 2: Unexamined Japanese Patent Application Kokai Publication No. H08-201493

SUMMARY OF INVENTION

Technical Problem

In a magnetic sensor device, the component that emits the most heat in the magnetic sensor device is the magnetoresistance effect element. The resolution and number of magnetoresistance effect elements are low in conventional magnetic sensor devices such as those in Patent Literature 1 and Patent Literature 2. Thus the amount of heat generation is low, and consideration of heat dissipation is not required in the construction of such conventional magnetic sensor devices. However, a large number of magnetoresistance effect elements are arranged in order to make a magnetic sensor device that has high resolution. Thus a large amount of heat is generated, and the magnetic sensor device tends to become hot. The magnet used in the magnetic sensor device demagnetizes when the magnetic sensor device becomes hot, and thus the performance of the magnetic sensor device is likely to decline.

The object of the present disclosure is to solve the aforementioned type of problem and to obtain a magnetic sensor device, that has excellent heat dissipation and is capable of suppressing the lowering of performance that is caused by heat generation by the magnetoresistance effect elements.

Solution to Problem

In order to achieve the aforementioned object, the magnetic sensor device of the present disclosure is equipped with a magnetic circuit for forming a magnetic field, magnetoresistance effect elements and a heat dissipater. The magnetoresistance effect elements output a change of magnetic field as a change of resistance value, and are arranged on a surface on an object-to-be-detected conveyance path side of the magnetic circuit. The heat dissipater is arranged in close contact with the magnetic circuit at a surface other than the conveyance path side surface of the heat dissipater. The magnetic circuit comprises, a magnet, a metallic carrier, having one surface in close contact with a surface of the conveyance path side of the magnet, and carrying the magnetoresistance effect element on another surface, and a yoke having one surface closely contacting a surface of the magnet opposite to the conveyance path side, and having another surface closely contacting the heat dissipater. The heat dissipater is disposed in close contact with a surface of the magnetic circuit of a side opposite to the conveyance path side of the magnetic circuit. The magnetic circuit comprises, a magnet, a metallic carrier, having one surface in close contact with a surface of the conveyance path side of the magnet, and carrying the magnetoresistance effect element on another surface, and a yoke having one surface closely contacting a surface of the magnet opposite to the conveyance path side, and having another surface closely contacting the heat dissipater.

Advantageous Effects of Invention

According to the present disclosure, the heat dissipater is arranged in close contact with the heat dissipater at a surface of the magnetic circuit other than that of the conveyance path side. Thus heat increase of the magnetic sensor device is suppressed, which enables suppression of the demagnetization of the magnet by heat. This has the effect of enabling the obtaining of the magnetic sensor device, that are capable of suppressing lowering of performance of the magnetoresistance effect elements.

DESCRIPTION OF EMBODIMENTS

Embodiment 1

Figure 1:
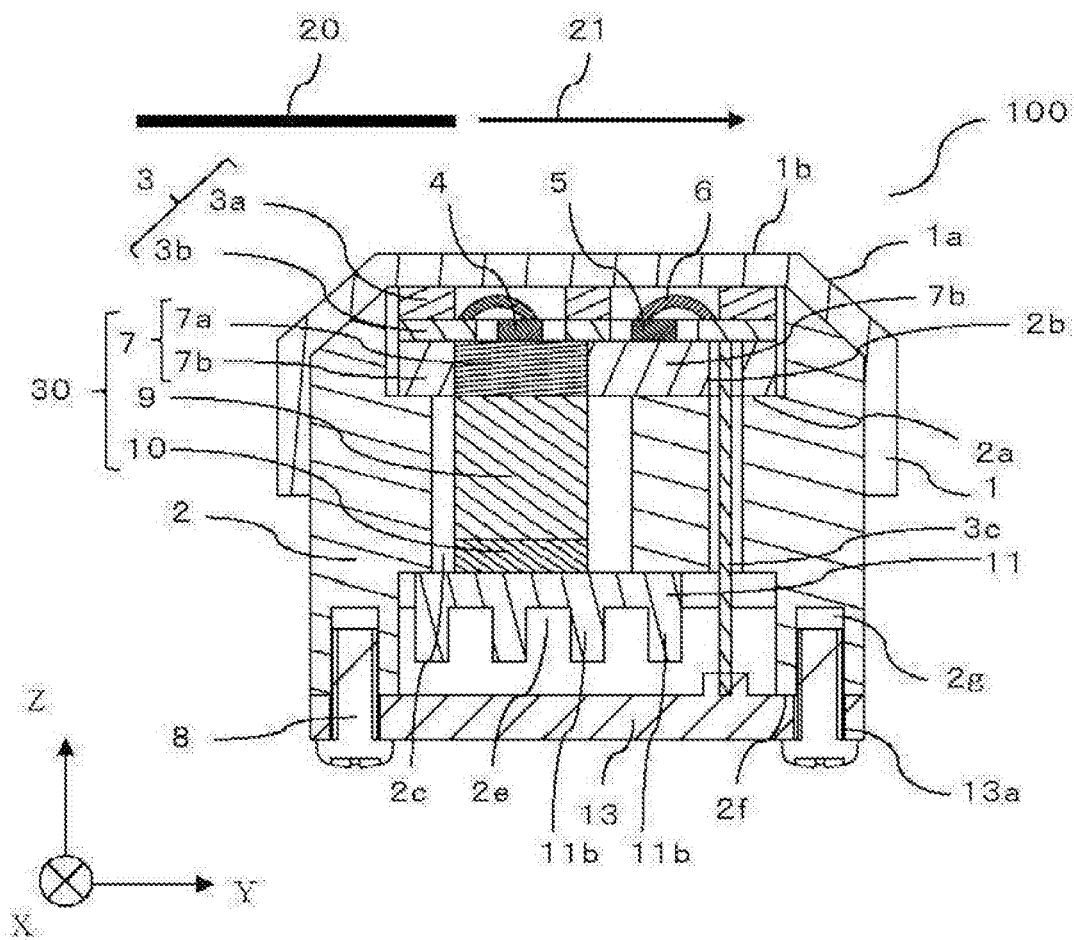
FIG. 1 is a cross-sectional drawing of a magnetic sensor device of Embodiment 1 of this disclosure.

A magnetic sensor device of Embodiment 1 of this disclosure are described below. Furthermore, in all the embodiments, the expression "conveyance of the object to be detected", in addition to the case of conveyance of the object to be detected, is taken to further include the case of moving the magnetic sensor device in the conveyance direction (Y direction of FIG. 1) without moving the object to be detected. Furthermore, the X direction is termed the "reading-width direction".

Further, the three axes labeled X, Y and Z in the drawings are three orthogonal axes. The X axis indicates the reading-width direction (longitudinal direction of the magnetic sensor device) of the magnetic sensor device. The Y axis indicates the conveyance direction (conveyance direction of the conveyed object to be detected, transverse direction of the magnetic sensor device) of the magnetic sensor device. The Z axis indicates the height direction of the magnetic sensor device. Further, the locations of conveyance of the object to be detected in the conveyance direction are termed the "conveyance path of the object to be detected". Here, the origin of the X axis is the center of X-axis direction length of the magnetic sensor device, and the direction of the arrow within the figures is the + direction (positive direction). The origin of the Y axis is the center of Y-axis direction length of the magnetic sensor device, and the direction of the arrow within the figures is the + direction (positive direction). The origin of the Z axis is the center of Z-axis direction length of the magnetic sensor device, and the direction of the arrow within the figures is the + direction (positive direction). Within the figures, identical reference signs indicate the same or equivalent components.

FIG. 1 is a cross-sectional drawing at the Z-Y plane of the magnetic sensor device of Embodiment 1 of this disclosure. The magnetic sensor device 100 illustrated in FIG. 1, for example, is used in a magnetic card reader or in an identification apparatus for printed articles (such as paper currency and the like) printed using magnetic ink. The magnetic sensor device 100, along the Z direction perpendicular to the conveyance direction 21 (Y direction) of the object to be detected 20 such as paper currency and the like, is equipped with a magnetic circuit 30 and a heat dissipater 11. The magnetic circuit 30 is equipped with a magnet 9, a yoke 10 and a metallic carrier 7 carrying magnetoresistance effect elements 4, having a magnetic carrier 7a, and a non-magnetic carrier 7b. The magnet 9 and the magnetic carrier 7a constituting the magnetic circuit 30 form a magnetic field by magnetic flux from one pole of the magnet 9 passing through the magnetic carrier 7a, overflowing to a space at the conveyance path side, turning back, passing through the yoke 10, and returning to the other pole of the magnet 9. The object to be detected 20 is conveyed through the conveyance path in a manner so as to pass through the void (space) where the magnetic field is formed.

Further, the magnetic sensor device 100 is equipped with a cover 1, a case 2, a sensor board 3, a signal amplification integrated circuit (referred to throughout the present disclosure as "IC") 5, a wire 6, a fastener 8 and a signal processing board 13.

Although the conveyance direction 21 in FIG. 1 is the +Y direction, the −Y direction may also be used.

Figure 2A:
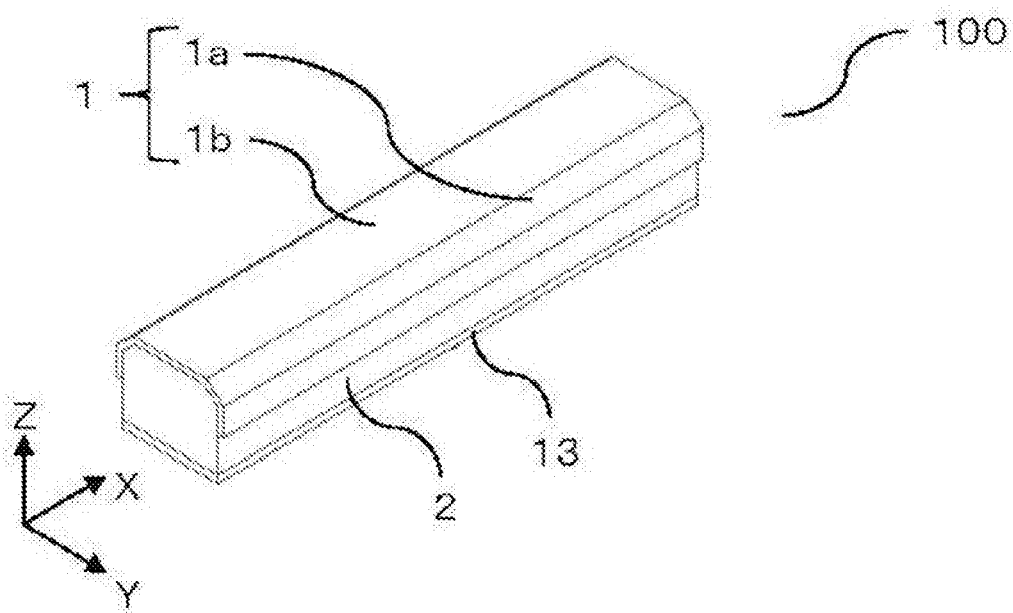
FIG. 2A is a perspective view of the magnetic sensor device of Embodiment 1, with a cover side oriented upward.
Figure 2B:
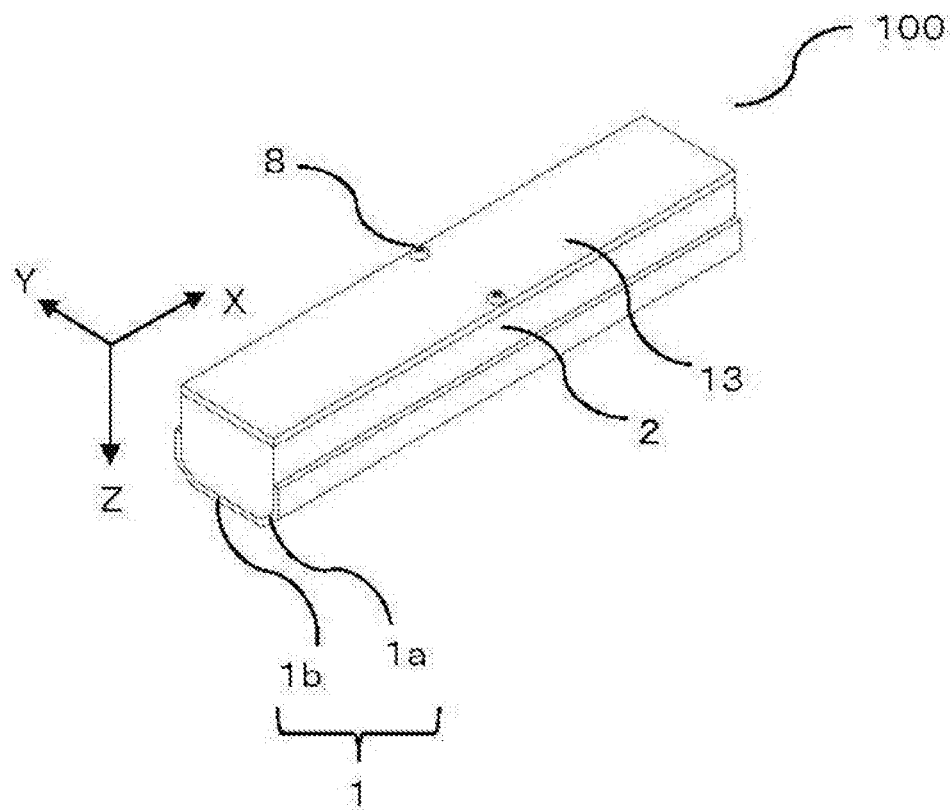
FIG. 2B is a perspective view of the magnetic sensor device of Embodiment 1, with a signal processing board side oriented upward.

FIG. 2A and FIG. 2B are perspective views of the magnetic sensor device of Embodiment 1 of this disclosure. FIG. 2A is a perspective view with the cover 1 oriented upward. FIG. 2B is a perspective view with the signal processing board 13 oriented upward. As illustrated in FIGS. 2A and 2B, the cover 1 is a component constituting the object-to-be-examined conveyance surface of the magnetic sensor device 100. The cover 1 extends in the X direction. The cover 1 is arranged at the conveyance path side of the case 2. The cover 1 has a conveyance surface 1b, which extends along the conveyance path, and tapers 1a. The tapers 1a are tilted toward a direction opposite to the conveyance path side, and are continuous with an upper and a lower end of the conveyance surface 1b in the conveyance direction 21. The cover 1 is shaped so as to cover the magnetoresistance effect elements 4.

The case 2 is formed from a housing as illustrated in FIG. 1. Holes 2b and 2c for containing and holding the various components constituting the magnetic sensor device 100, holes for positioning, and a board mounting surface 2f are formed in the case 2.

The sensor board 3 is arranged between the cover 1 and a metallic carrier 7. The sensor board 3 has a structure that laminates in the Z direction a non-conductive member 3a and a conductive member 3b, which forms a wiring pattern. The non-conductive member 3a is fixed by double-sided tape, adhesive and the like to the cover 1. The conductive member 3b is fixed by double-sided tape, adhesive and the like to the metallic carrier 7.

The magnetoresistance effect element 4 is arranged at the conveyance path side (+Z side) of the magnet 9. Further, the magnetoresistance effect element 4 is fixed by adhesive and the like to the +Z side (conveyance path side) surface of the magnetic carrier 7a. The magnetoresistance effect element 4 is electrically connected through the wire 6 to the conductive member 3b of the sensor board 3.

The signal amplification IC 5 is fixed by adhesive and the like to a +Z side (conveyance path side) surface of the non-magnetic carrier 7b. The signal amplification IC 5 is electrically connected through the wire 6 to the conductive member 3b of the sensor board 3. By this means, the signal amplification IC 5 is electrically connected to the magnetoresistance effect elements 4.

Figure 3A:
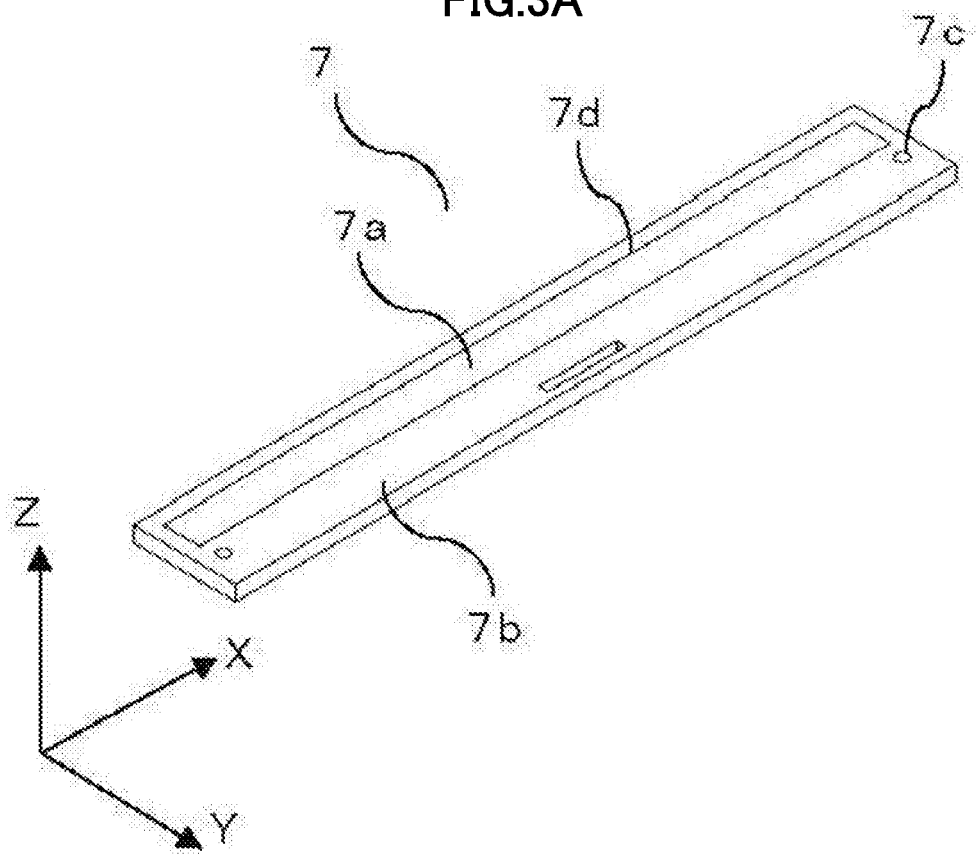
FIG. 3A is a perspective view of a metallic carrier in the magnetic sensor device of Embodiment 1.
Figure 3B:
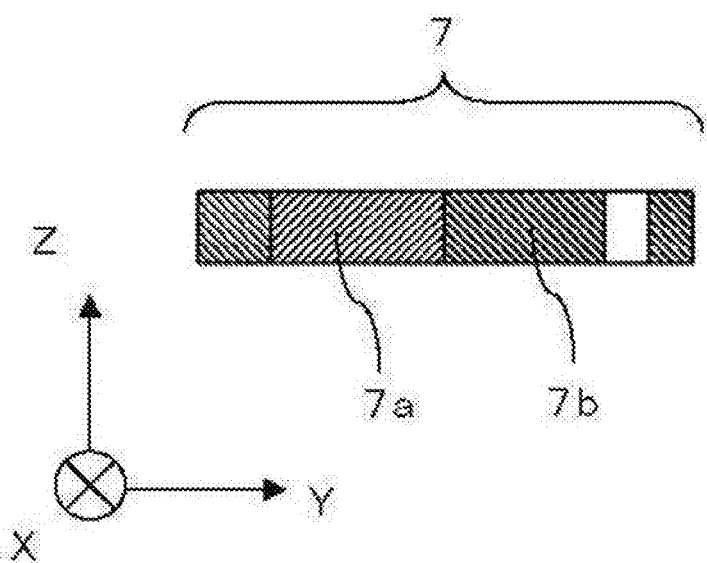
FIG. 3B is a cross-sectional drawing of the metallic carrier in the magnetic sensor device of Embodiment 1.

FIG. 3A is a perspective view of the metallic carrier, and FIG. 3B is a cross-sectional drawing of the metallic carrier. As illustrated in FIGS. 3A and 3B, the metallic carrier 7 is in close contact with the conveyance path side surface of the magnet 9 (+Z side surface of the magnet 9) and carries the magnetoresistance effect element 4. The metallic carrier 7 is integrally formed by contact between the magnetic carrier 7a and the non-magnetic carrier 7b in the Y direction (conveyance direction 21). The metallic carrier 7 is fitted from a hole 2b opening (conveyance path side opening) of the case 2, and is fixed using adhesive and the like.

The magnet 9, as illustrated in FIG. 1, is constituted by a permanent magnet. The magnet 9 is fixed by adhesive and the like to a surface of the metallic carrier 7 of the side thereof opposite to the surface contacting the sensor board 3 (fixed to the −Z side surface of the metallic carrier 7).

The yoke 10 is close attached to a surface of the side opposite to the surface (−Z side surface of the magnet 9) of the magnet 9 closely attached to the metallic carrier 7. The yoke 10 is fixed by adhesive and the like to the surface (−Z side surface of the magnet 9) of the magnet 9 opposite to the surface contacting the metallic carrier 7. The yoke 10 is a plate of a magnetic metal.

The heat dissipater 11 is in close contact with a surface (−Z side surface of the yoke 10) of the yoke 10 that is opposite to the surface of close contact with the magnet 9. This heat dissipater 11 is a component for release of internal heat of the magnetic sensor device 100 to the external air. The heat dissipater 11 is fitted into a hole 2e opening (opening of the side opposite to the conveyance path side) of the case 2, and is fixed using adhesive and the like to the surface (−Z side surface of the yoke 10) of the yoke 10 of the side opposite to the surface contacting the magnet 9. The heat dissipater 11 has fins 11b projecting at the side thereof opposite to the conveyance path side. The fins 11b are arranged in rows in the Y direction and are integrally formed with the main body of the heat dissipater 11.

That is to say, the heat dissipater 11 is in close contact with the surface of the magnetic circuit 30 opposite to the conveyance path side, which is a surface other than the conveyance path side surface of the magnetic circuit 30.

The signal processing board 13 is electrically connected through a cable 3c to the sensor board 3. The signal processing board 13 is attached to the side (−Z side of the case 2) of the case 2 opposite to the side contacting the cover 1. The signal processing board 13 covers the heat dissipater 11 by this means.

As illustrated in FIGS. 2A and 2B, the cover 1 is a component comprising the object-to-be-examined conveyance surface of the magnetic sensor device 100. The cover 1 is produced by bending a thin metal sheet. The cover 1 has tapers 1a from the conveyance path side of the object to be detected 20 tilted toward the direction (−Z direction) opposite to this conveyance path side. The tapers 1a function as conveyance guides. During conveyance, due to these tapers 1a, the object to be detected 20 moves along the tapers 1a. This configuration enables prevention of the object to be detected 20 from moving in a direction other than the conveyance direction (Y direction).

The cover 1 has a role of protecting the magnetic sensor device 100 from shock and wear due to collision, chafing and the like during conveyance of the object to be detected 20 upon the magnetic sensor device 100. Further, noise generation occurs in the signal amplification IC 5 in reaction to light, and thus the cover 1 has a role of blocking external light so that the external light does not reach the signal amplification IC 5. This cover 1 is arranged between the object to be detected 20 and the magnetoresistance effect elements 4. Thus the material of the cover 1 is preferably non-magnetic in order not to influence magneto-sensitivity of the magnetic sensor device 100.

In Embodiment 1 of this disclosure, the cover 1 is produced by bending a thin metal sheet. However, the aforementioned material and production method are not limiting. As long as the cover 1 has the aforementioned roles, the cover 1 may be produced by a method other than thin metal sheet bending.

Figure 2C:
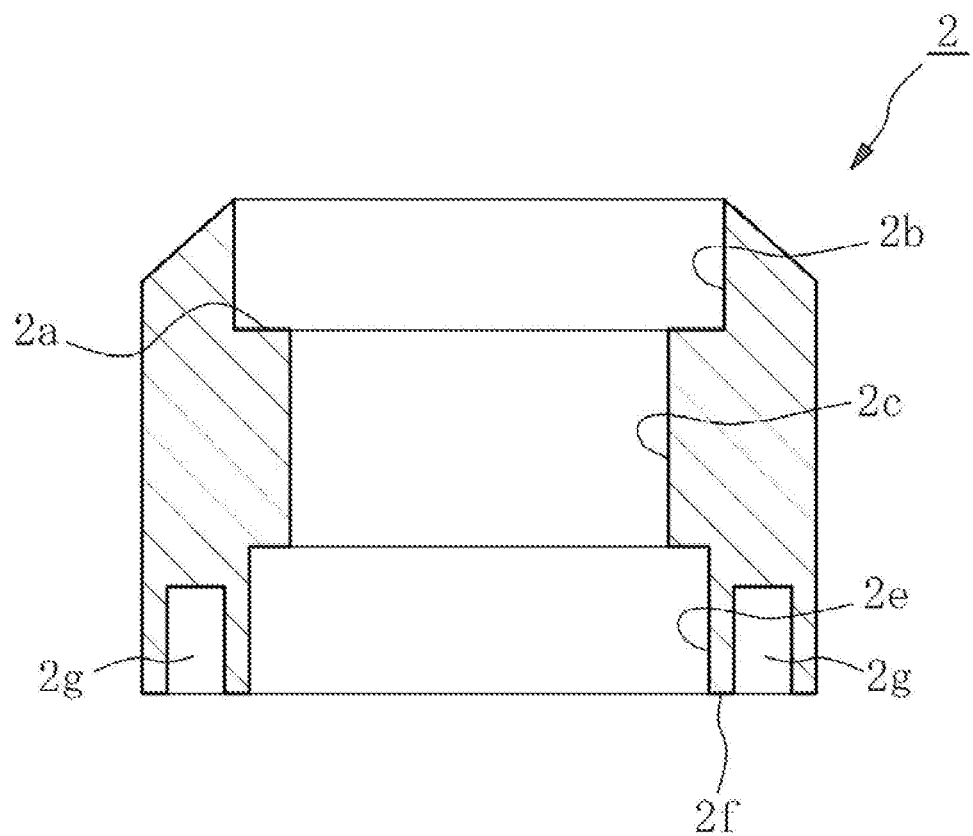
FIG. 2C is a cross-sectional drawing of a case of Embodiment 1.

FIG. 2C is a cross-sectional drawing of the case of the magnetic sensor device. As illustrated in FIGS. 2A to 2C, the case 2 is a component for internal containment of other components. The case 2 is formed from a black resin. The step 2a, the holes 2b, 2c and 2e, the board mounting surface 2f, and the board mounting hole 2g are formed in the case 2.

The step 2a is used for Z-direction support of the metallic carrier 7 assembled together with the sensor board 3, magnetoresistance effect elements 4, signal amplification IC 5 and wire 6. The step 2a is arranged at the conveyance path side of the case 2.

The hole 2b has an opening end in the +Z side surface and is used for X-Y direction positioning of the metallic carrier 7 integrated together with the sensor board 3, magnetoresistance effect element 4, signal amplification IC 5 and wire 6. The hole 2b is arranged in the conveyance path side (+Z side) of the case 2, and the step 2a is used as a bottom portion of the hole 2b.

The hole 2c is used for arrangement and X-Y direction positioning of the integrated magnet 9 and yoke 10. The hole 2c is a through hole that penetrates from the hole 2b to the hole 2e.

The hole 2e has an opening formed in the −Z side surface, and is used for X-Y direction positioning of the heat dissipater 11 during attachment of the heat dissipater 11 to the yoke 10. The hole 2e is arranged at the surface of the case 2 of the side (−Z side) opposite to the conveyance path side.

The board mounting surface 2f is arranged at the surface of the side (−Z side) opposite to the side of the conveyance path of the object to be detected 20. The board mounting surface 2f is used for attachment of the signal processing board 13.

The board mounting hole 2g is used for positioning of the signal processing board 13 and for fixing thereof to the case 2.

Noise generation occurs in the signal amplification IC 5 in reaction to light, and thus the case 2 has a role of blocking external light so that the external light does not reach the signal amplification IC 5.

In Embodiment 1 of this disclosure, the case 2 is formed from the black resin. However, use of the above material is not limiting. As long as the case 2 has the aforementioned role, formation is possible using a material other than the black resin.

As illustrated in FIG. 1, the sensor board 3 has the non-conductive member 3a and the conductive member 3b. The non-conductive member 3a is used for arranging a space such that the cover 1 does not contact the magnetoresistance effect element 4, signal amplification IC 5, and wire 6. Wiring for transmitting electrical signals of the magnetoresistance effect element 4 and the signal amplification IC 5 is arranged in the conductive member 3b. The cable 3c is used for transmission of electrical signals from the sensor board 3 to the signal processing board 13.

Figure 4A:
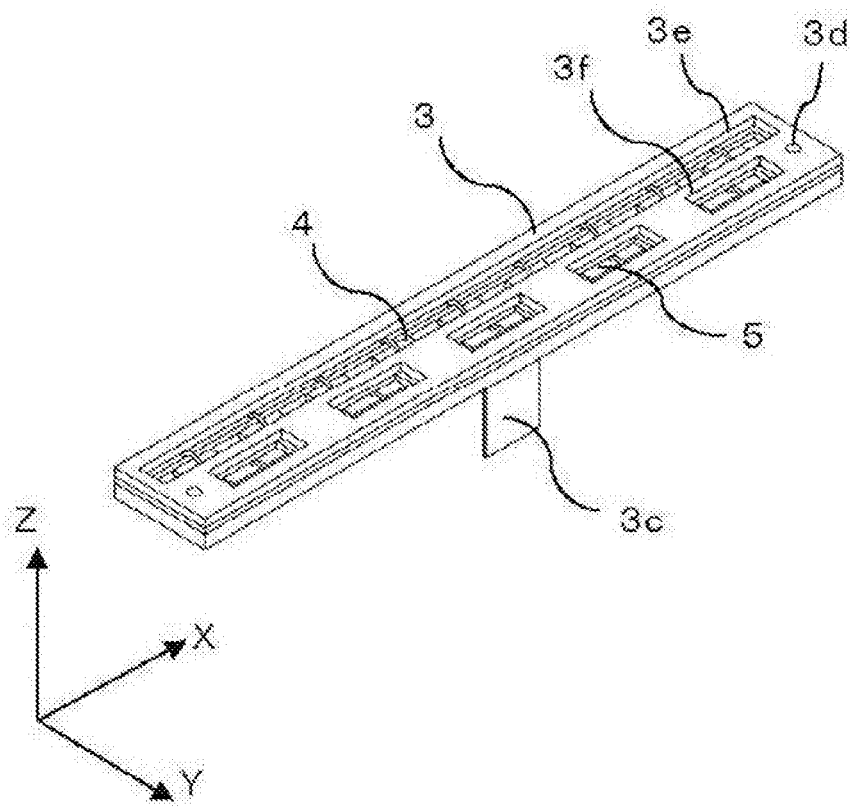
FIG. 4A is a perspective view illustrating a state of assembly of a sensor board, carrier, magnetoresistance effect elements and signal amplification ICs in the magnetic sensor device of Embodiment 1.
Figure 4B:
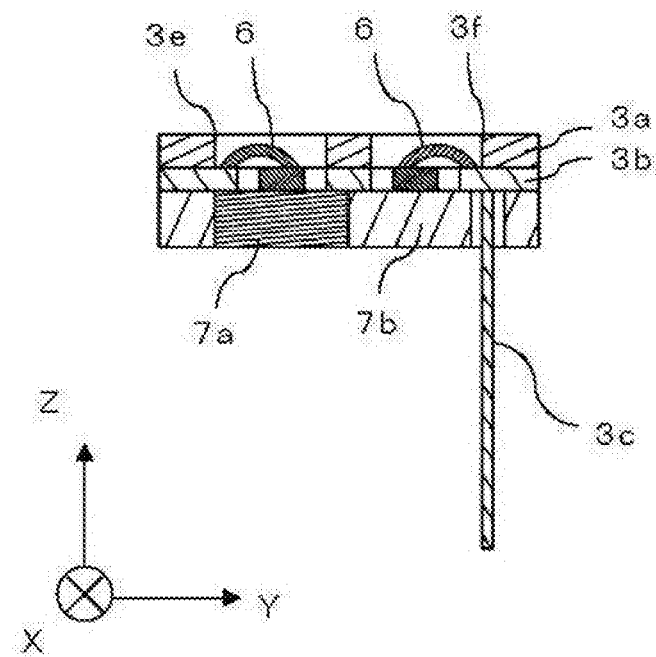
FIG. 4B is a perspective view illustrating a state of assembly of the sensor board, carrier, magnetoresistance effect element and signal amplification IC in the magnetic sensor device of Embodiment 1.

The sensor board 3 is attached to the surface of the +Z side (side of the conveyance path of the object to be detected 20) of the metallic carrier 7. The sensor board 3 is positioned by contact with the metallic carrier 7. As shown in FIGS. 4A and 4B, positioning holes 3d are formed in the sensor board 3. The positioning holes 3d are formed in the vicinities of both X-direction end portions of the sensor board 3. As illustrated in FIGS. 3A and 3B, positioning holes 7c are formed in the metallic carrier 7. The positioning holes 7c are formed in the vicinities of both X-direction end portions of the metallic carrier 7. As illustrated in FIGS. 3A, 3B, 4A and 4B, pins are inserted in the positioning holes 3d and 7c. By this means, the positioning holes 3d and 7c are coaxially stacked, and thus the sensor board 3 is positioned relative to the metallic carrier 7. The positioning holes 3d and the positioning holes 7c are each formed in at least two locations.

Figure 4C:
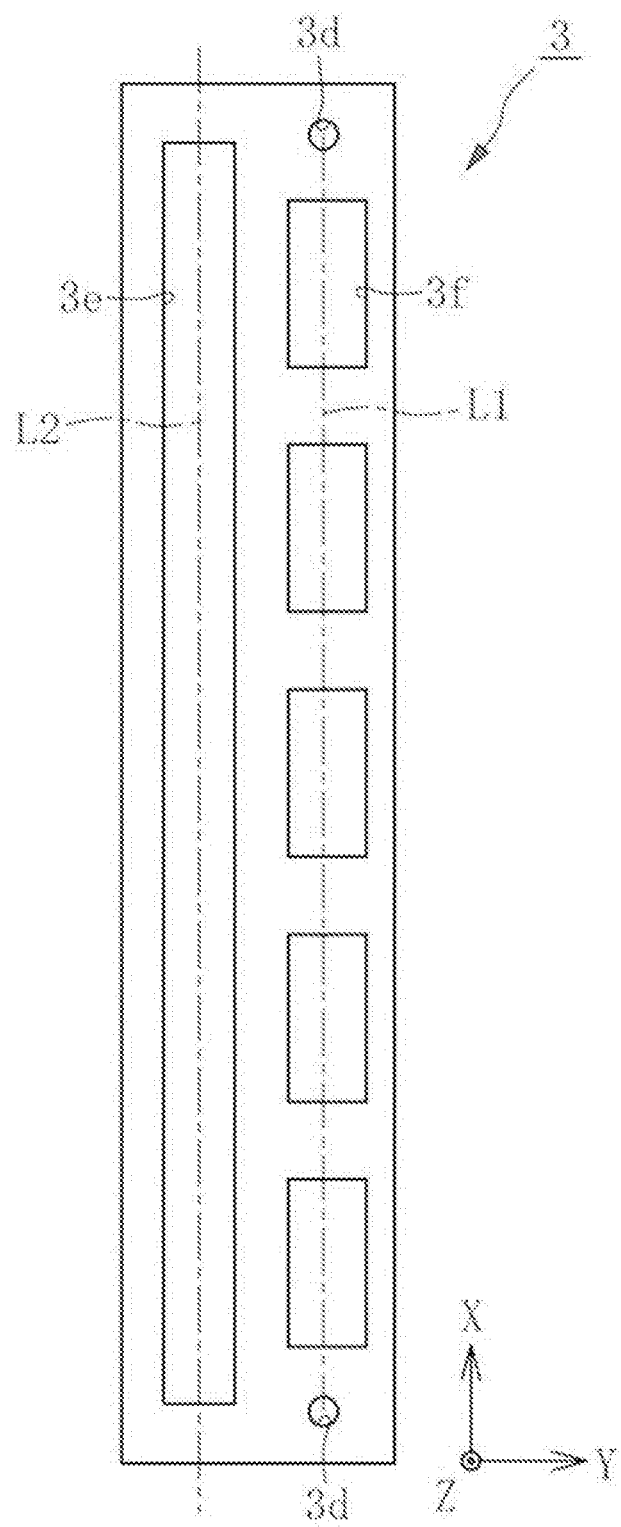
FIG. 4C is a plan view of the sensor board of the magnetic sensor device of Embodiment 1.

As illustrated in FIG. 1, the magnetoresistance effect element 4 is fixed by adhesive and the like to the same surface of the magnetic carrier 7a as that used for attachment of the sensor board 3. Z-direction position of the magnetoresistance effect element 4 is determined by contact with the magnetic carrier 7a. Moreover, the magnetoresistance effect element 4 is arranged within the opening 3e used for the magnetoresistance effect element 4 of the sensor board 3. As illustrated in FIG. 4C, the magnetoresistance effect element 4 is arranged on a virtual line L2 parallel to a straight line L1 interconnecting the positioning holes 3d at both ends of the sensor board 3. However, the Y-direction position for fixing the magnetoresistance effect elements 4 is not limited to that of this configuration. In response to the position of the object to be detected 20, the virtual line L2 may be offset parallel to both the X direction and Y direction.

The magnetoresistance effect element 4 detects the change of the conveyance direction component of the magnetic field that occurs due to conveyance in the conveyance direction 21 of the object to be detected 20, such as paper currency and the like, which includes a magnetic component. Specifically, the resistance value of the magnetoresistance effect element 4 changes with the change of the magnetic field. Based on this change of the resistance value, the magnetoresistance effect element 4 detects the change of the magnetic field. Then the magnetoresistance effect element 4 outputs a signal corresponding to the amount of change of the magnetic field.

As illustrated in FIG. 1, the signal amplification IC 5 is fixed by adhesive and the like to a surface of the non-magnetic carrier 7b that is the same as the surface of attachment of the sensor board 3. Z-direction position of the signal amplification IC 5 is determined by contact with the non-magnetic carrier 7b. Further, the signal amplification IC 5 is positioned in the X-Y plane of the signal amplification IC 5 by arrangement in the vicinity of the X-Y plane center of the opening 3f used for the signal amplification IC 5.

The signal amplification IC 5 amplifies the signal output from the magnetoresistance effect element 4.

The wire 6 electrically connects together the magnetoresistance effect element 4 and the signal amplification IC 5 to the conductive member 3b of the sensor board 3.

The metallic carrier 7 has the magnetic carrier 7a and the non-magnetic carrier 7b. Z-direction position of the metallic carrier 7 is determined by causing one Z-direction surface of the metallic carrier 7 (surface of the side opposite to the conveyance path of the object to be detected 20, −Z side surface) to contact the step 2a of the case 2.

The metallic carrier 7 supports the sensor board 3 in the Z direction. The magnetic carrier 7a has a role of directing the magnetic field of the magnet 9 in the Z direction.

One surface in the Z direction (−Z side surface, surface opposite to the side of the conveyance path of the object to be detected 20) of the magnet 9 contacts the yoke 10. The X-direction sizes of the magnet 9 and yoke 10 are equal, and the Y-direction sizes are also equal. The integrated magnet 9 and yoke 10 are arranged parallel to the magnetoresistance effect element 4. The surface (conveyance path side surface of the magnet 9) of the magnet 9 opposite to the surface of contact between the magnet 9 and the yoke 10 and the surface (surface of the metallic carrier 7 at the side opposite to the conveyance path side) of the metallic carrier 7 opposite to the surface of contact of the sensor board 3 of the metallic carrier 7 are fixed by adhesion. Z-direction position of the magnet 9 is determined by securing together this surface of the magnet 9 and the surface of the metallic carrier 7. Further, the position of the magnet 9 in the X-Y plane relative to the magnetoresistance effect elements 4 is also determined. The magnetic forces imparted to the magnetoresistance effect elements 4 and the object to be detected 20 change when the Y-direction position of the magnet 9 changes, and thus the Y-direction position of the magnet 9 is preferably finely adjusted according to the performance of the magnetic sensor device 100.

The magnet 9 has a role of generating the magnetic field and imparting magnetic force to the object to be detected 20. The yoke 10 has a role of strengthening the magnetic field generated by the magnet 9.

The heat dissipater 11 is fixed by adhesive and the like to the surface of the yoke 10 opposite to the surface contacting the magnet 9. The Z-direction position of the heat dissipater 11 is determined by this means. Further, the position of the heat dissipater 11 in the X-Y directions is determined by causing the heat dissipater 11 to contact each of the X-Y direction surfaces within the inner perimeter surface of the hole 2e of the case 2.

The heat dissipater 11 radiates to the exterior of the magnetic sensor device 100 the heat generated mainly by the magnetoresistance effect element 4 and the signal amplification IC 5. The heat dissipater 11 has a role of suppressing high temperature in the magnetic sensor device 100 in itself The signal processing board 13 is electrically connected through the cable 3c to the sensor board 3. The Z-direction position of the signal processing board 13 is determined by causing contact between one Z-direction surface (surface of the side of the conveyance path of the object to be detected 20) of the signal processing board 13 and the board mounting surface 2f of the case 2. Due to use of the fasteners 8 to fix the signal processing board 13 in a state in which the axis of the board mounting hole 2g of the case 2 and the axis of the board mounting hole 13a of the signal processing board 13 overlap, X-Y direction position of the signal processing board 13 relative to the case 2 is determined. Here, the fastener 8, for example, is a screw. However, this configuration is not limiting, and a component other than a screw may be used as the fastener 8, as long as the fastener 8 is a means, such as caulking and the like, that enables fixing of the signal processing board 13 to the case 2.

The method of production of the magnetic sensor device of Embodiment 1 of this disclosure is explained below using FIG. 3A to FIG. 4B and FIG. 5 to FIG. 10. The production method of the magnetic sensor device 100 includes a carrier assembly step, a sensor board assembly step, a permanent magnet assembly step, and a final assembly step. Among these steps, the carrier assembly step is performed prior to the sensor board assembly step, and the final assembly step is performed after the other steps.

The carrier assembly step is explained using FIGS. 3A and 3B. The carrier assembly step is a step of assembly of the metallic carrier 7 by fixing the magnetic carrier 7a to the opening 7d of the non-magnetic carrier 7b. The magnetic carrier 7a is fixed, for example, by adhesion using a resin adhesive, bonding using caulking, and the like. If thicknesses are different between the magnetic carrier 7a and the non-magnetic carrier 7b at this time, one of the Z-direction surfaces is taken to be a standard, and the other surface is arranged to form a single surface free of a step.

The sensor board assembly step is explained using FIGS. 4A and 4B. The sensor board assembly step is a step for attaching the sensor board 3 and the like to one surface of the metallic carrier 7. In the sensor board assembly step, the magnetoresistance effect elements 4 are arranged parallel to the X axis direction on the magnetic carrier 7a, and the signal amplification ICs 5 are arranged parallel to the X axis direction on the non-magnetic carrier 7b portion, of the metallic carrier 7. Then the magnetoresistance effect elements 4 and the signal amplification ICs 5 are electrically connected to the conductive member 3b of the sensor board 3 through the wires 6.

During attachment of the sensor board 3, the magnetoresistance effect elements 4, and the signal amplification ICs 5 to the metallic carrier 7, the surface used for attachment to the metallic carrier (+Z side surface of the metallic carrier 7) is a surface that has no step between the magnetic carrier 7a and the non-magnetic carrier 7b.

When the magnetoresistance effect elements 4 are attached to the magnetic carrier 7a, the magnetoresistance effect elements 4 are attached so that the magnetoresistance effect elements 4 do not protrude in the +Z direction from the opening 3e of the sensor board 3. In the same manner, when the signal amplification ICs 5 are attached to the non-magnetic carrier 7b, the signal amplification ICs 5 are attached so that the signal amplification ICs 5 do not protrude in the +Z direction from the openings 3f of the sensor board 3.

Figure 5:
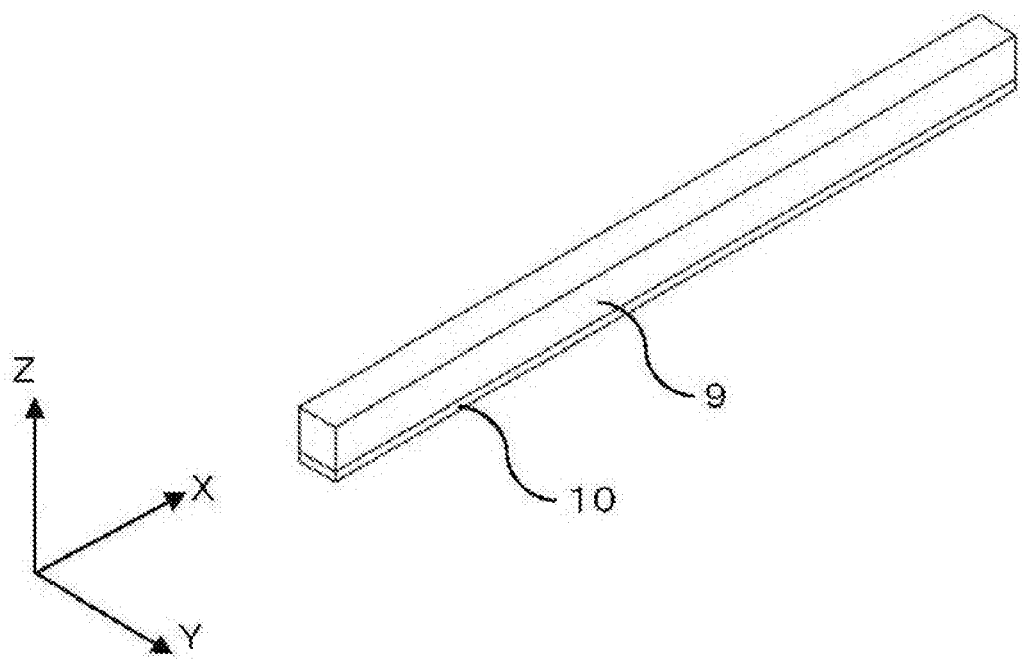
FIG. 5 is a perspective view illustrating a state of contact between a permanent magnet and a yoke in the magnetic sensor device of Embodiment 1.

The magnet assembly step is explained using FIG. 5. The magnet assembly step is a step integrating together the magnet 9 and the yoke 10. Further, the magnet 9 is not necessarily a single component, and a plurality of magnets 9 separated from one another in the X direction (longitudinal direction) may be integrated together. The position of the magnet 9 relative to the yoke 10 is determined by attaching the magnets 9 to a +Z side surface of the yoke 10, and aligning side surfaces in each of the X and Y directions of the magnet 9 and yoke 10. At this time, all the S pole and N pole directions of all the magnets 9 are aligned in the same direction. The magnets 9 are fixed to the yoke 10 using an adhesive and the like.

Figure 6:
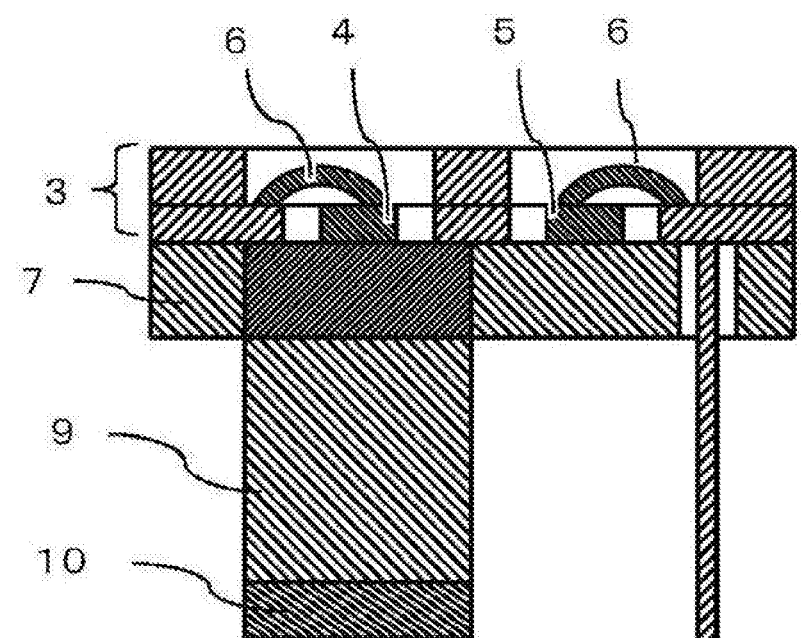
FIG. 6 is a cross-sectional drawing illustrating the state in which the carrier and a permanent magnet are attached and integrated together in the state of FIG. 4 of the magnetic sensor device of Embodiment 1.
Figure 7:
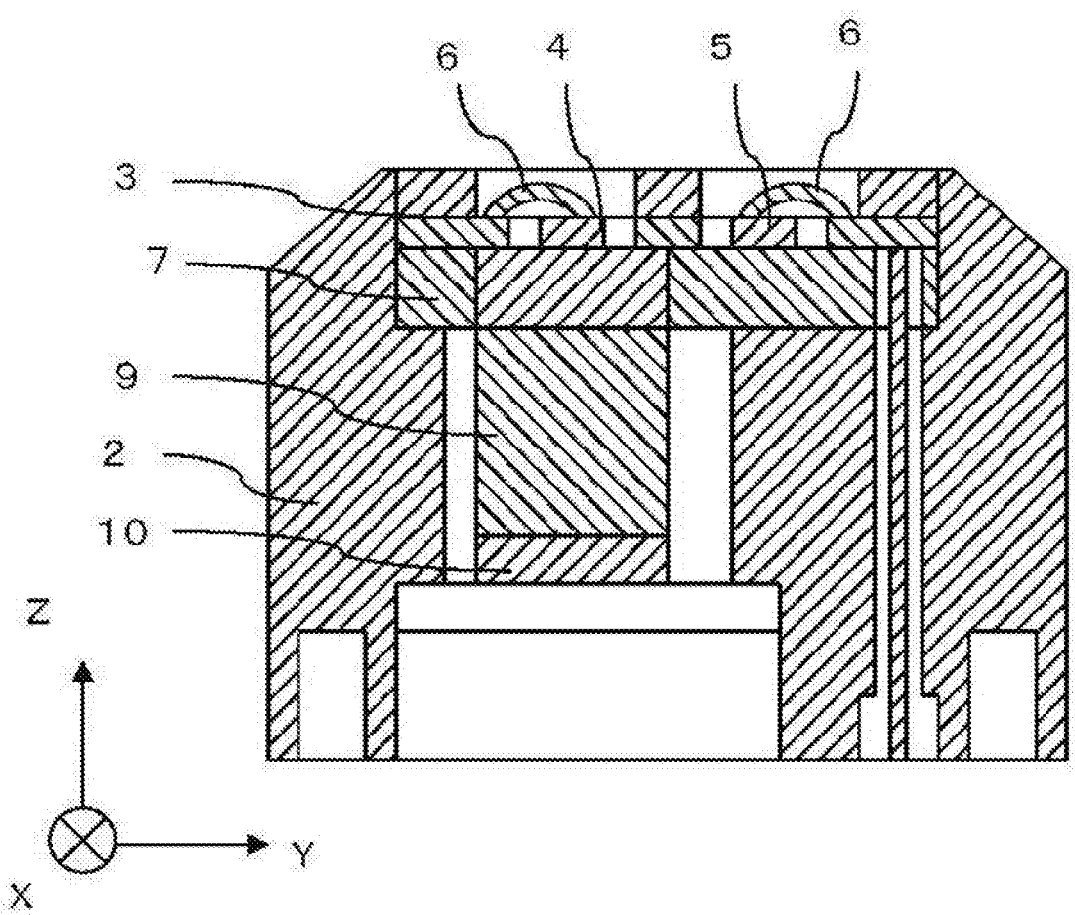
FIG. 7 is a cross-sectional drawing illustrating a state of attachment of components of the FIG. 6 state to the case in the magnetic sensor device of Embodiment 1.
Figure 8:
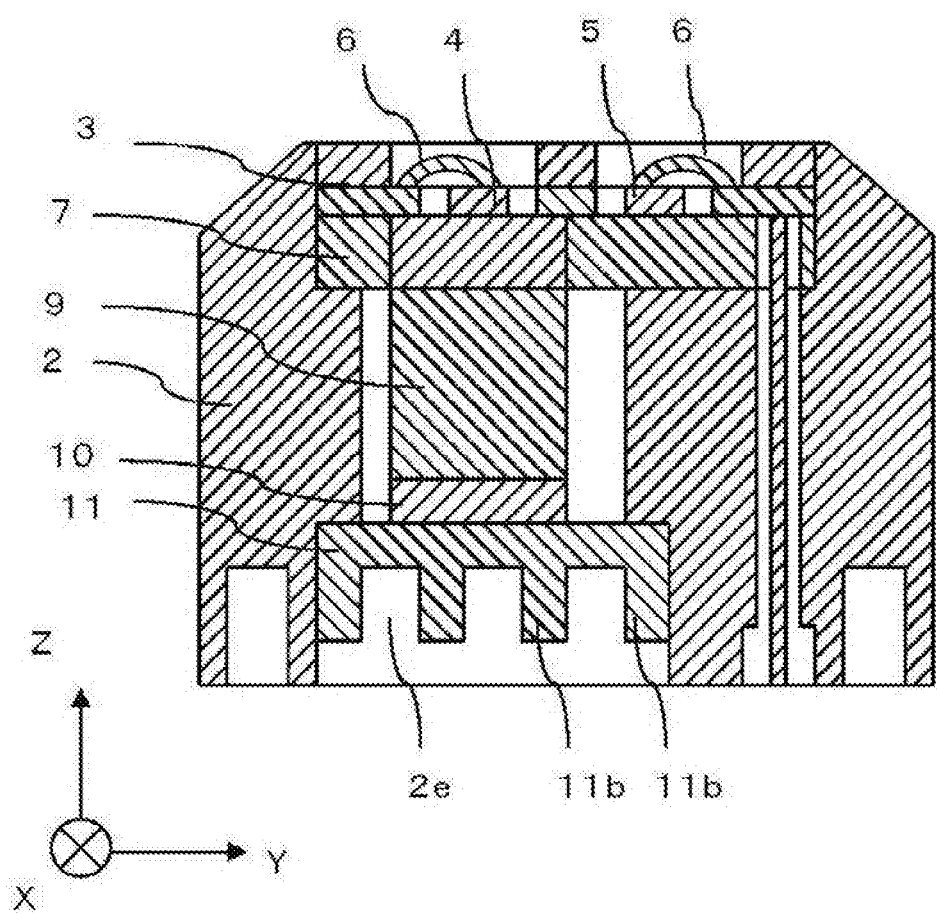
FIG. 8 is a cross-sectional drawing illustrating a state of attachment of the heat dissipater in the state of FIG. 7 for the magnetic sensor device of Embodiment 1.
Figure 9:
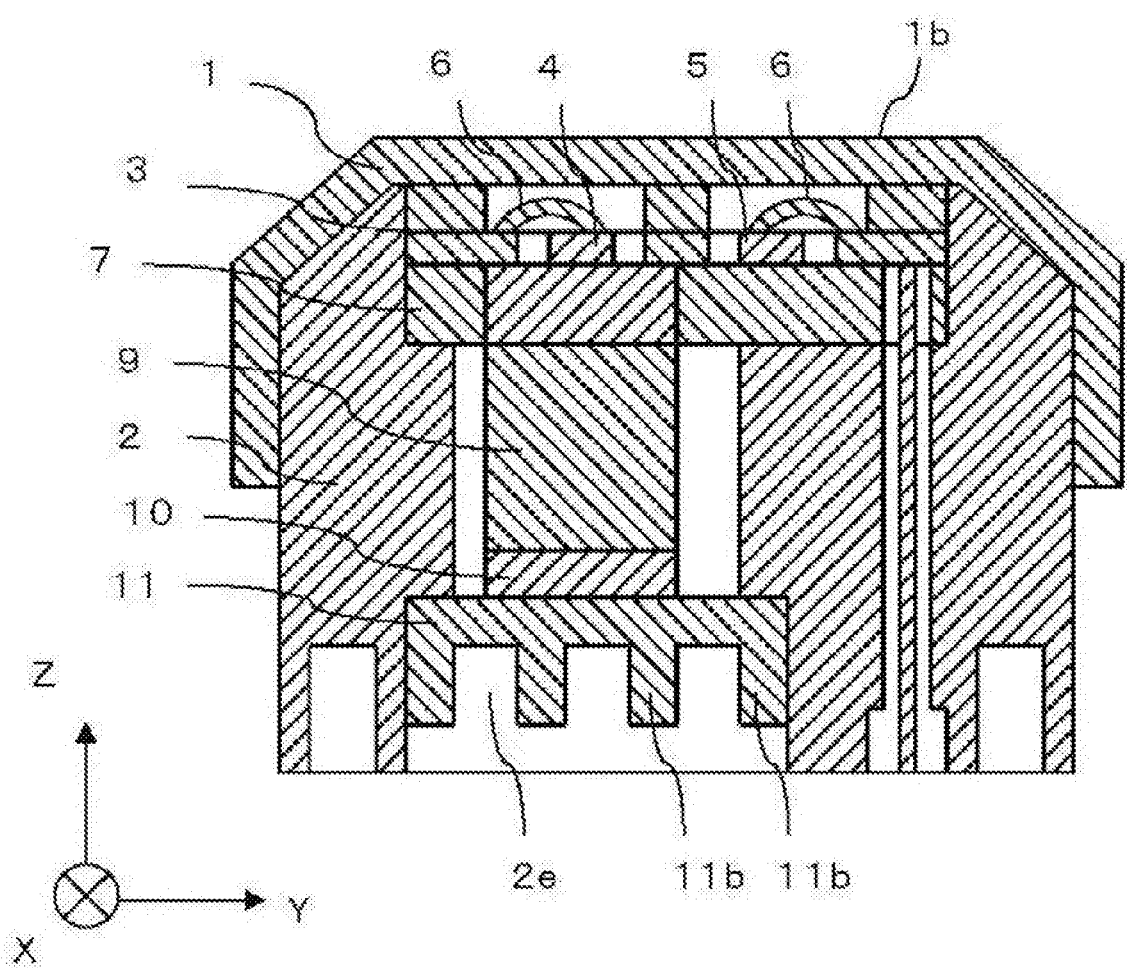
FIG. 9 is a cross-sectional drawing illustrating a state of attachment of the cover in the state of FIG. 8 for the magnetic sensor device of Embodiment 1.
Figure 10:
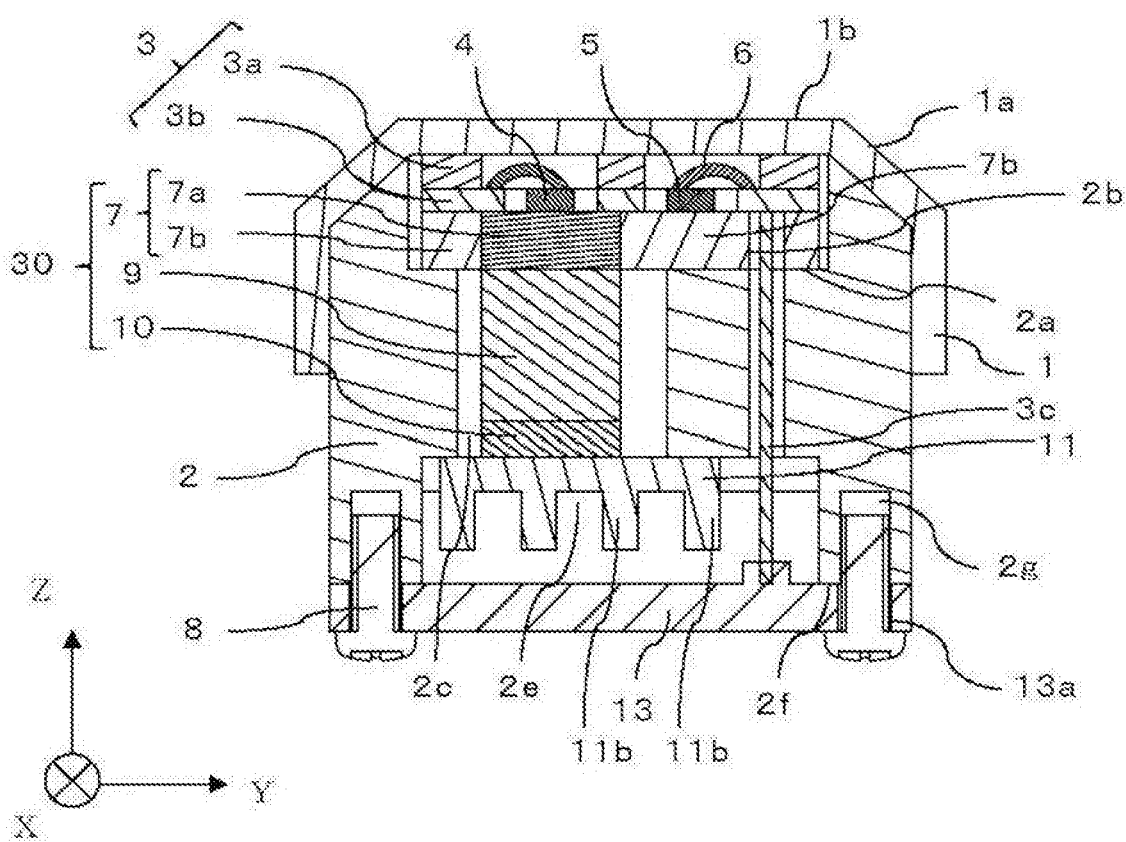
FIG. 10 is a cross-sectional drawing of the case in the magnetic sensor device of Embodiment 1.

The final assembly step is described using FIGS. 6 to 10. The final assembly step has procedures such as those described below. The magnet 9 is fixed to the metallic carrier 7 as illustrated in FIG. 6. This metallic carrier 7, with the affixed magnet 9, is fixed to the case 2 as illustrated in FIG. 7. Further, the heat dissipater 11 is fixed to the yoke 10 as illustrated in FIG. 8. Moreover, the cover 1 is fixed to the sensor board 3 as illustrated in FIG. 9. FIG. 10 illustrates the magnetic sensor device with the signal processing board 13 fixed to the case 2 and with the signal processing board 13 electrically connected to the sensor board 3.

As shown in FIG. 6, the surface (surface of the +Z side) of the magnet 9 opposite to the surface of fixing of the yoke 10 is attached to the surface (surface of the −Z side) of the metallic carrier 7 opposite to the surface attached to the sensor board 3. At this time, the magnet 9 is arranged along the magnetic carrier 7a, and the X-direction centers of the magnet 9 and the magnetic carrier 7a are aligned. Further, position of the magnet 9 affects the performance of the magnetic sensor device, and thus a jig may be separately used for adjustment of the fixing position of the magnet 9.

As illustrated in FIG. 7, the surface (surface of the −Z side) of the side of the metallic carrier 7 opposite to the surface of attachment of the sensor board 3 is contacted against the step 2a of the case 2. By causing the side surface of the metallic carrier 7 to contact the inner surface of the hole 2b of the case 2, the metallic carrier 7 is fitted into the hole 2b from the opening thereof. By this means, the magnet 9 is arranged within the hole 2c of the case 2.

As illustrated in FIG. 8, the heat dissipater 11 is attached to the surface (surface of the −Z side) of the side of the yoke 10 opposite to the surface of attachment of the magnet 9. At this time, position of the heat dissipater 11 in the X-Y directions is determined by fitting the heat dissipater 11 into the hole 2e of the case 2.

As illustrated in FIG. 9, the surface (surface of the −Z side) of the side of the cover 1 opposite to the conveyance surface 1b is attached to the surface (surface of the +Z side of the sensor board 3) of the side of the sensor board 3 opposing the surface contacting the metallic carrier 7. At this time, the cover 1 is attached so as to partially cover the +Y side and −Y side surfaces (surfaces parallel to the X-Z plane) of the case 2. Position of the cover 1 is determined in the X direction by aligning the X-direction center of the cover 1 with the X-direction center of the case 2.

As illustrated in FIG. 10, the signal processing board 13 is attached to the case 2 from the −Z side, and the surface (one surface in the Z direction) of the +Z side of the signal processing board 13 is made to contact the board mounting surface 2f of the case 2. Also, the board mounting hole 13a of the signal processing board 13 and the board mounting hole 2g of the case 2 are made to overlap, and the fastener 8 is screwed into the board mounting hole 13a and the board mounting hole 2g. The signal processing board 13 is positioned relative to the case 2 by this means. Moreover, the cable 3c is electrically connected to the signal processing board 13.

Next, FIG. 1 is used to describe the path of heat transmitted from the interior of the magnetic sensor device 100 to the exterior air.

The main sources of heat in the magnetic sensor device 100 are the magnetoresistance effect element 4 and the signal amplification IC 5. The heat generated by the magnetoresistance effect element 4 and the signal amplification IC 5 is transmitted to the metallic carrier 7 that contacts the magnetoresistance effect element 4 and the signal amplification IC 5. The metallic carrier 7 contacts the sensor board 3, the case 2, and the magnet 9. The non-conductive member 3a of the sensor board 3 is formed from glass epoxy and does not include metal for conduction. Thus the heat conduction coefficient of the non-conductive member 3a is relatively low (heat conduction coefficient of general glass epoxy is 0.4 W/m·K). Further, due to formation of the case 2 from resin, the heat conduction coefficient of the case 2 is relatively low (heat conduction coefficient of general polycarbonate resin is 0.24 W/m·K). On the other hand, the magnet 9 is formed as a neodymium sintered magnet (heat conduction coefficient of general neodymium sintered magnet is 6.5 W/m·K), and the heat conduction coefficient of the magnet 9 is higher than the heat conduction coefficients of the metallic carrier 7 and the case 2. Thus most of the heat from the metallic carrier 7 is transmitted to the magnet 9 (heat conduction coefficient of general neodymium sintered magnet is 6.5 W/m·K).

The magnet 9 contacts the metallic carrier 7. The metallic carrier 7 contacts the yoke 10, to which is attached the heat dissipater 11. Thus the heat transmitted to the magnet 9 is transmitted to the metallic carrier 7 and the yoke 10, and is radiated from the heat dissipater 11.

As described above, in the magnetic sensor device 100 of the present Embodiment 1, the heat dissipater 11 is arranged in close contact with the −Z side (side opposite to the conveyance path) of the magnetic circuit 30. Thus temperature rise of the magnetic sensor device 100 is suppressed, which enables the suppression of demagnetization of the magnet 9 by heat, and enables the obtaining of stable output without lowering of sensitivity.

Figure 11:
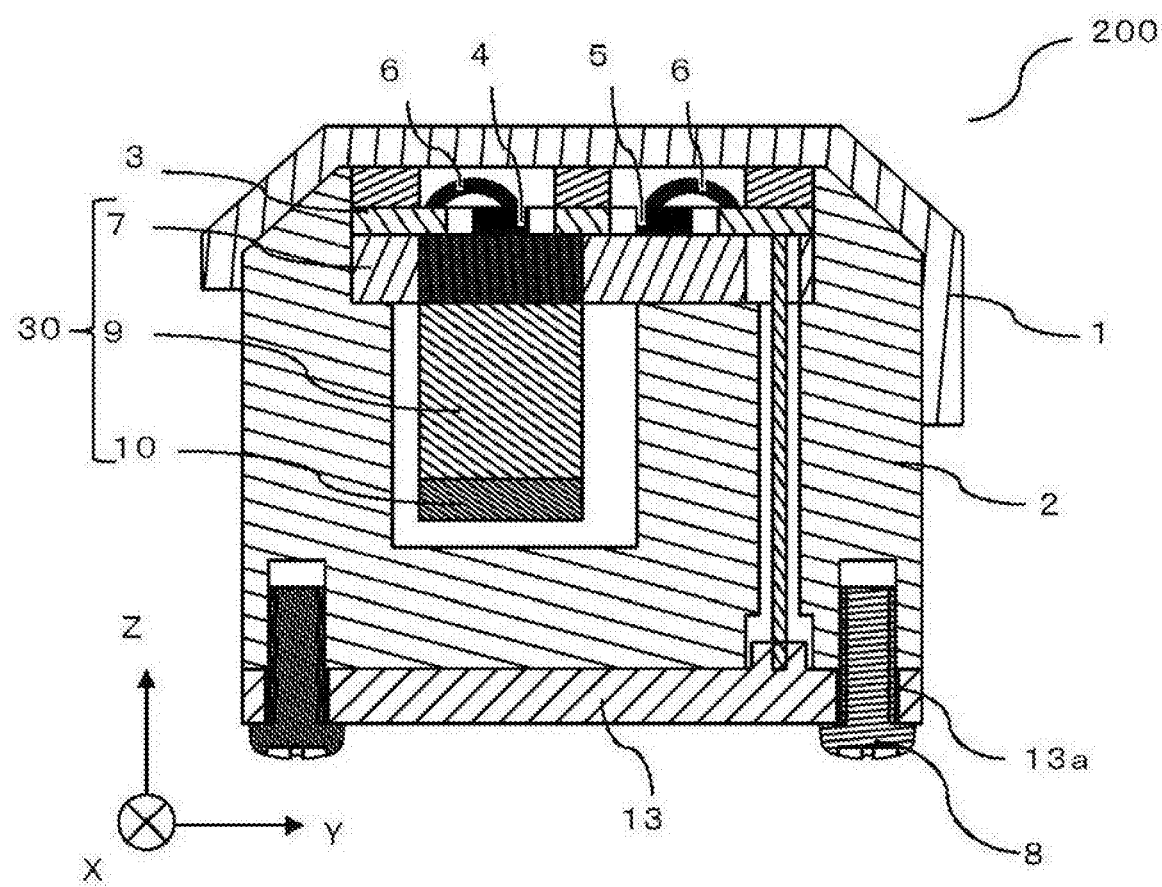
FIG. 11 is a cross-sectional drawing of a magnetic sensor device of a comparative example.

For example, in the case of a magnetic sensor device 200, as illustrated in the comparative example of FIG. 11, that has no heat dissipater 11 and in which the opening of the hole 2e is not formed in the case 2, the heat generated by the magnetoresistance effect elements 4 and the signal amplification ICs 5 are transmitted from the magnetoresistance effect elements 4 and the signal amplification ICs 5, in order, to the metallic carrier 7, magnet 9, and yoke 10. Then heat from the yoke 10 is unable to be transmitted to the exterior of the magnetic sensor device 200 except by thermal radiation. Moreover, even though heat is transmitted to the case 2 by thermal radiation, due to formation of the case 2 from resin, heat radiation efficiency is low.

Thus transmission of the heat generated by the magnetoresistance effect element 4 and the signal amplification IC 5 to the exterior air tends to be difficult, and the temperature of the magnetic sensor device 200 tends to be high. When the temperature of the magnet 9 becomes high, the magnetism field applied to the object to be detected becomes weak, and performance of the magnetic sensor device 200 declines due to demagnetization.

In contrast, the heat dissipater 11 is arranged in close contact with the magnetic circuit 30 in the magnetic sensor device 100 of the present Embodiment 1, and thus rise of temperature of the magnetic sensor device 100 is suppressed, the demagnetization of the magnet 9 due to heat can be suppressed, and stable output is obtained without lowering of sensitivity.

Further, the case 2 of the magnetic sensor device 100 is formed from resin. However, this configuration is not limiting. The case 2 may be formed from a material that has a high heat transfer coefficient, such as a metal and the like. Such configuration enables radiation of heat through the case 2 to the exterior air, thereby enabling further increase of heat dissipation efficiency.

Embodiment 2

In Embodiment 1 of the present disclosure, the magnetic sensor device is described in which the heat dissipater 11 closely contacts the surface of the magnetic circuit 30 of the side opposite to the surface of the conveyance path side. In Embodiment 2, a magnetic sensor device is described in which the heat dissipater 11 closely contacts a surface of the magnetic circuit 30 other than surface of the side opposite to the surface of the conveyance path side.

Figure 12:
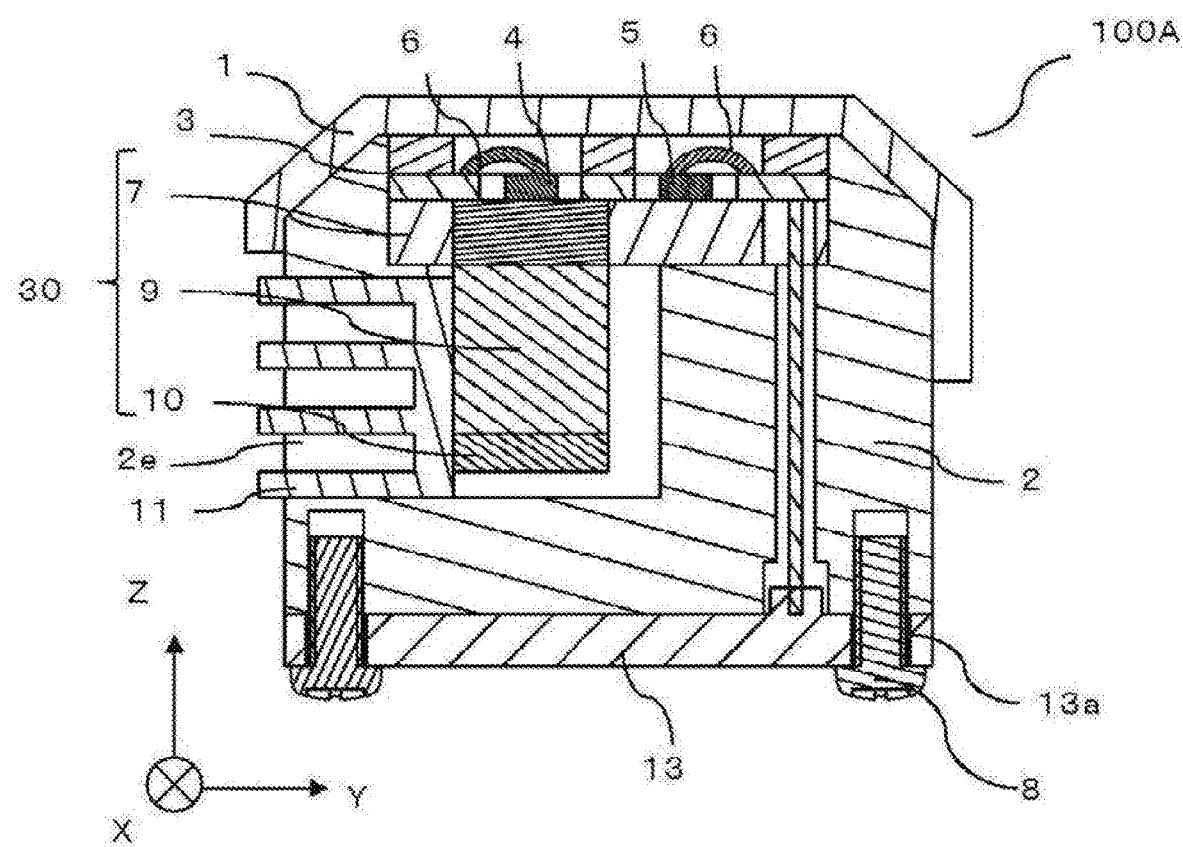
FIG. 12 is a cross-sectional drawing of a magnetic sensor device of Embodiment 2 of this disclosure.

FIG. 12 is used for description of the configuration of the magnetic sensor device of Embodiment 2 of the present disclosure. FIG. 12 is a cross-sectional drawing of a magnetic sensor device 100A. In FIG. 12, constituent elements that are the same or equivalent to those of FIG. 1 are assigned the same reference signs.

As illustrated in FIG. 12, the heat dissipater 11 of the magnetic sensor device 100A is exposed to the exterior. Further, in order to determine the position of the heat dissipater 11, the hole 2e is formed in the case 2 of the magnetic sensor device 100A. The opening of the hole 2e is formed in a −Y direction side surface of the case 2. X-Z direction positions of the heat dissipater 11 are determined by fitting the heat dissipater 11 into the case 2 from the hole 2e opening. Further, position of the heat dissipater 11 in the Y-axis direction is determined by attachment of the heat dissipater 11 to the −Y side surface of the yoke 10 and the magnet 9 constituting the magnetic circuit 30.

That is to say, the heat dissipater 11 closely contacts the Y-direction side surface of the magnetic circuit 30, which is the surface of the magnetic circuit 30 other than the conveyance path-side surface of the magnetic circuit 30.

As described above, in the present Embodiment 2, the heat generated by the magnetoresistance effect element 4 and the signal amplification IC 5 is transmitted, in order, to the metallic carrier 7 and the magnet 9, and is radiated to the exterior from the magnet 9 through the heat dissipater 11. Due to radiation of the heat to the exterior without traversing the yoke 10, thermal resistance up until radiation to the exterior can be made small, and the efficiency of thermal radiation can be improved. Moreover, in contrast to the magnetic sensor device 100 of the present Embodiment 1, the heat dissipater 11 is exposed to the exterior, and thus the release of heat to the exterior is not impeded by the signal processing board 13. Thus the present Embodiment 2 enables further improvement of the heat dissipation efficiency.

In the magnetic sensor is described in Embodiment 2, the heat dissipater 11 is in close contact with the Y-direction side surface of the magnetic circuit 30. A configuration may be used in which the heat dissipater 11 is in close contact with both the Y-direction side surface of the magnetic circuit 30 and the surface of the magnetic circuit 30 of the side opposite to the surface of the conveyance direction side.

Embodiment 3

Figure 13A:
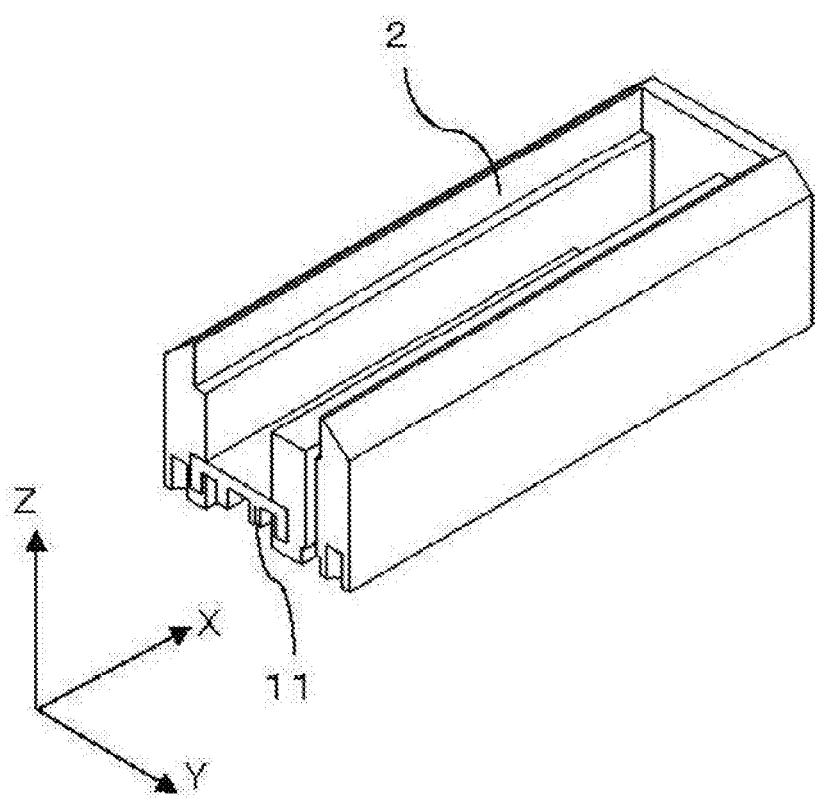
FIG. 13A is a perspective view illustrating in partial cross section of the case of a magnetic sensor device of Embodiment 3 of this disclosure.
Figure 13B:
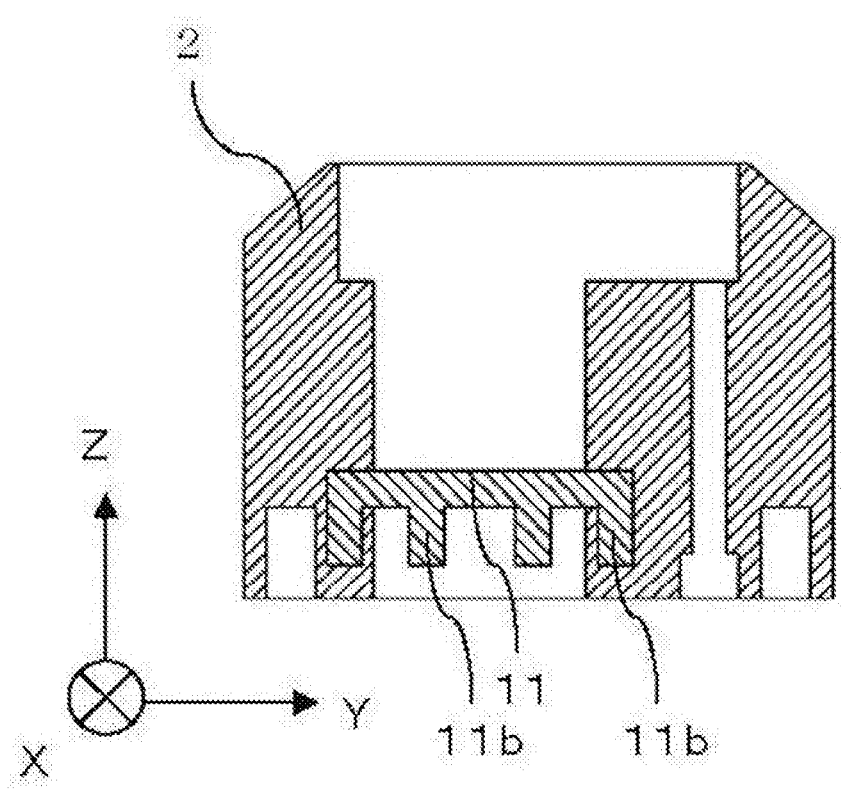
FIG. 13B is a cross-sectional drawing of the case of the magnetic sensor device of Embodiment 3.
Figure 14:
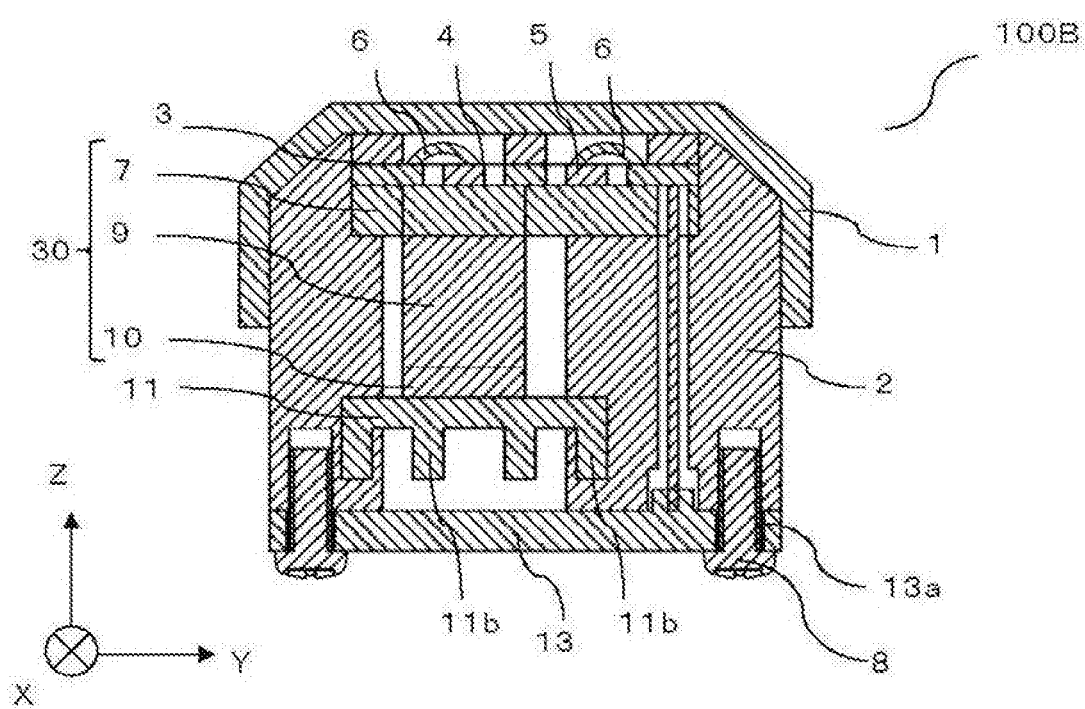
FIG. 14 is a cross-sectional drawing of the magnetic sensor device of Embodiment 3.

Configuration of a magnetic sensor device of Embodiment 3 of the present disclosure is described next using FIGS. 13A, 13B and 14. FIG. 13A is a perspective view of a cross-sectioned portion of the case 2 of the magnetic sensor device. The FIG. 13B is a cross-sectional drawing of the case 2 of the magnetic sensor device. FIG. 14 is a cross-sectional drawing of the magnetic sensor device. In FIGS. 13A, 13B and 14, constituent elements that are the same or equivalent to those of FIG. 1 are assigned the same reference signs.

As illustrated in FIGS. 13A, 13B and 14, the heat dissipater 11 of the magnetic sensor device 100B is insert-molded in the case 2. The heat dissipater 11 has a plurality of fins 11b projecting toward the side (-Z side) opposite to the conveyance path side. The plurality of fins 11b, for example, is arranged in the Y direction. The heat dissipater 11 is held by the case 2 by embedding of both end portions of the +Y side and -Y side of the heat dissipater 11 in the case 2.

As described above, the heat dissipater 11 in the present Embodiment 3 is insert-molded in the case 2. Thus the number of components of the magnetic sensor device 100B decreases. Further, the operation of attaching the heat dissipater 11 to the yoke 10 during the final assembly step becomes unnecessary.

Moreover, due to formation of the heat dissipater 11 from a metal, which generally has a high heat transfer coefficient, toughness of the case 2 can be increased by insert-molding of the heat dissipater 11 in the case 2. Further, in Embodiment 3, the heat dissipater 11 is insert-molded in the case 2. However, this configuration is not limiting. The heat dissipater 11 may be integrally formed with the case 2 by a method other than insert-molding.

Embodiment 4

Figure 15:
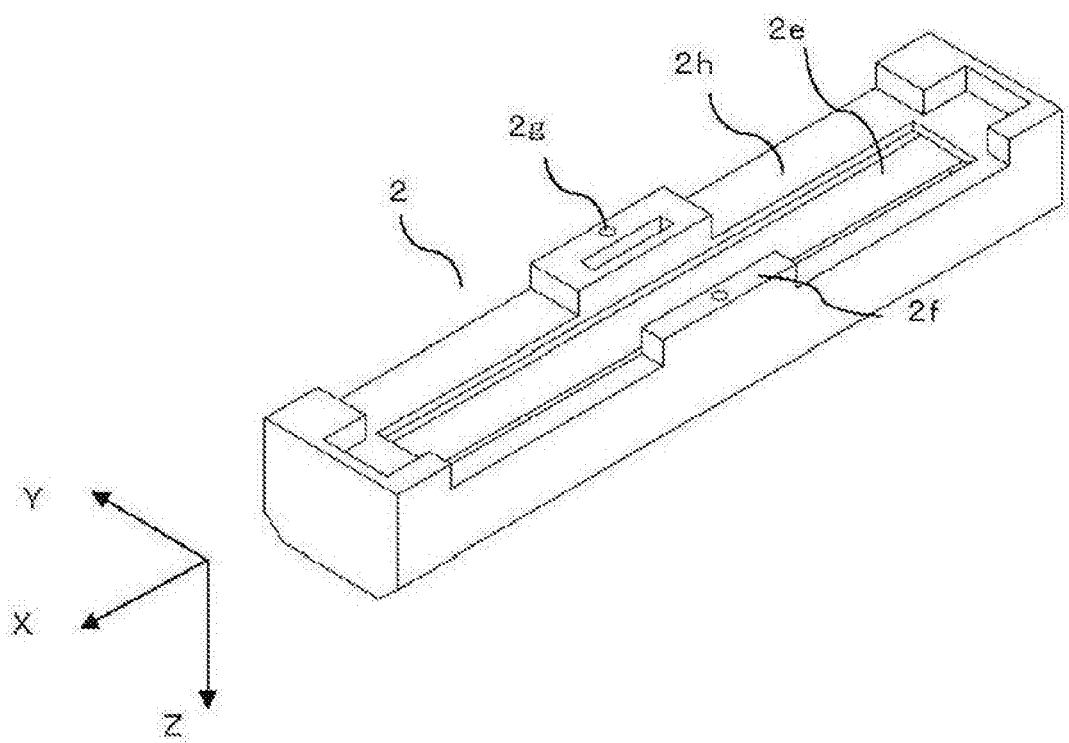
FIG. 15 is a perspective view of a case of a magnetic sensor device of Embodiment 4 of this disclosure.
Figure 16:
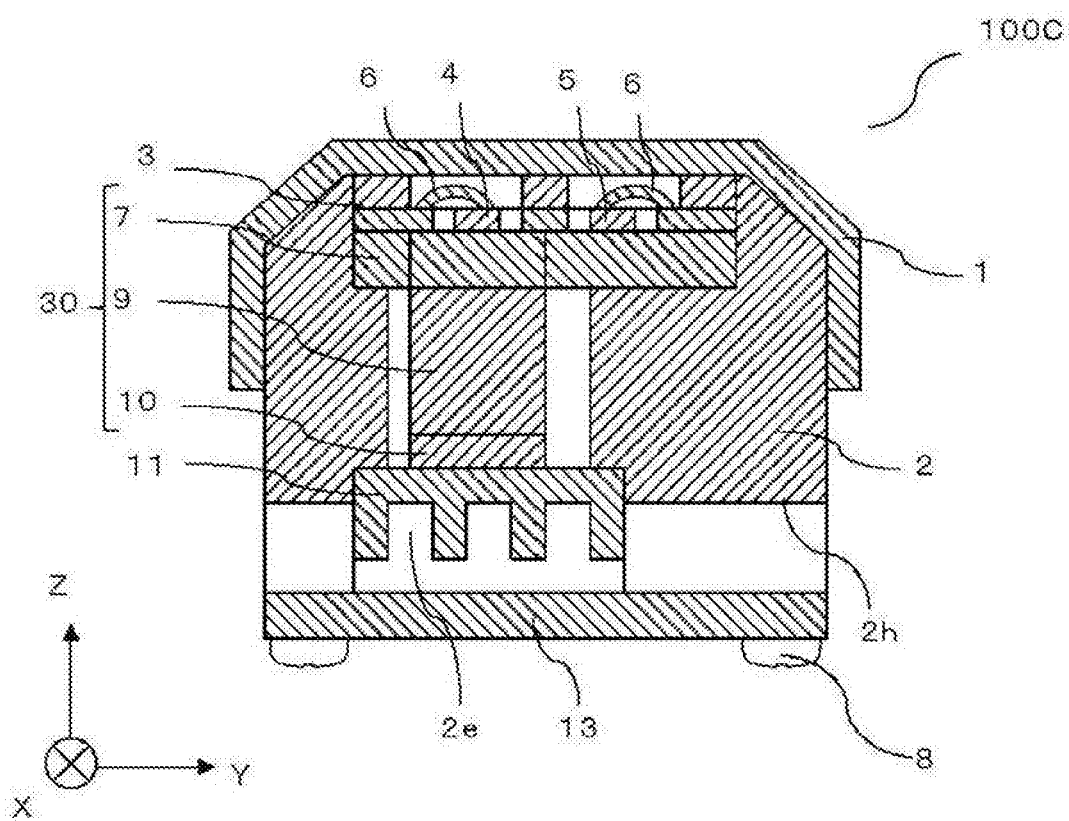
FIG. 16 is a cross-sectional drawing of the magnetic sensor device of Embodiment 4.

Configuration of a magnetic sensor device of Embodiment 4 of the present disclosure is described next using FIGS. 15 and 16. FIG. 15 is a perspective view of the magnetic sensor device of Embodiment 4 with the board mounting surface of the case oriented upward. FIG. 16 is a cross-sectional drawing of the magnetic sensor device of Embodiment 4. In FIGS. 15 and 16, constituent elements that are the same or equivalent to those of FIG. 1 are assigned the same reference signs.

In the surface of the -Z side of the case 2 of the magnetic sensor device 100C illustrated in FIG. 15, in addition to the board mounting surface 2f, an offset surface 2h is formed that is offset in the +Z direction from the board mounting surface 2f. As illustrated in FIG. 16, space in the vicinity of the heat dissipater 11 communicates with the exterior due to formation of the offset surface 2h. This has the effect of enabling improvement of heat radiation efficiency.

Embodiment 5

Figure 17:
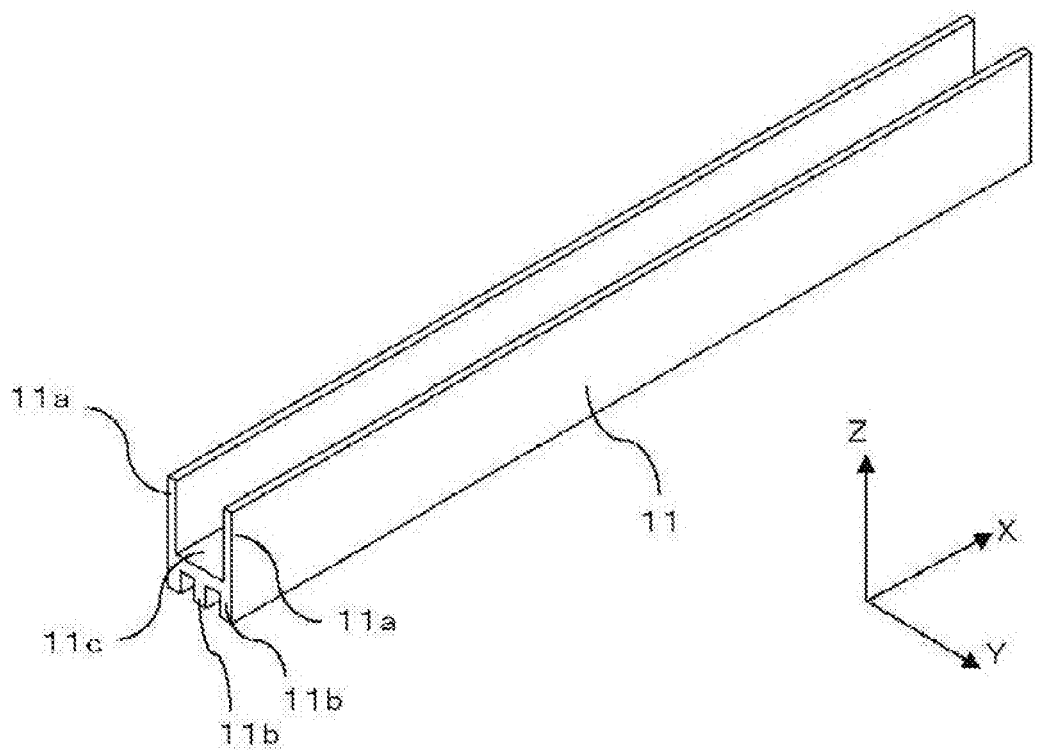
FIG. 17 is a perspective view of a heat dissipater in a magnetic sensor device of Embodiment 5 of this disclosure.
Figure 18:
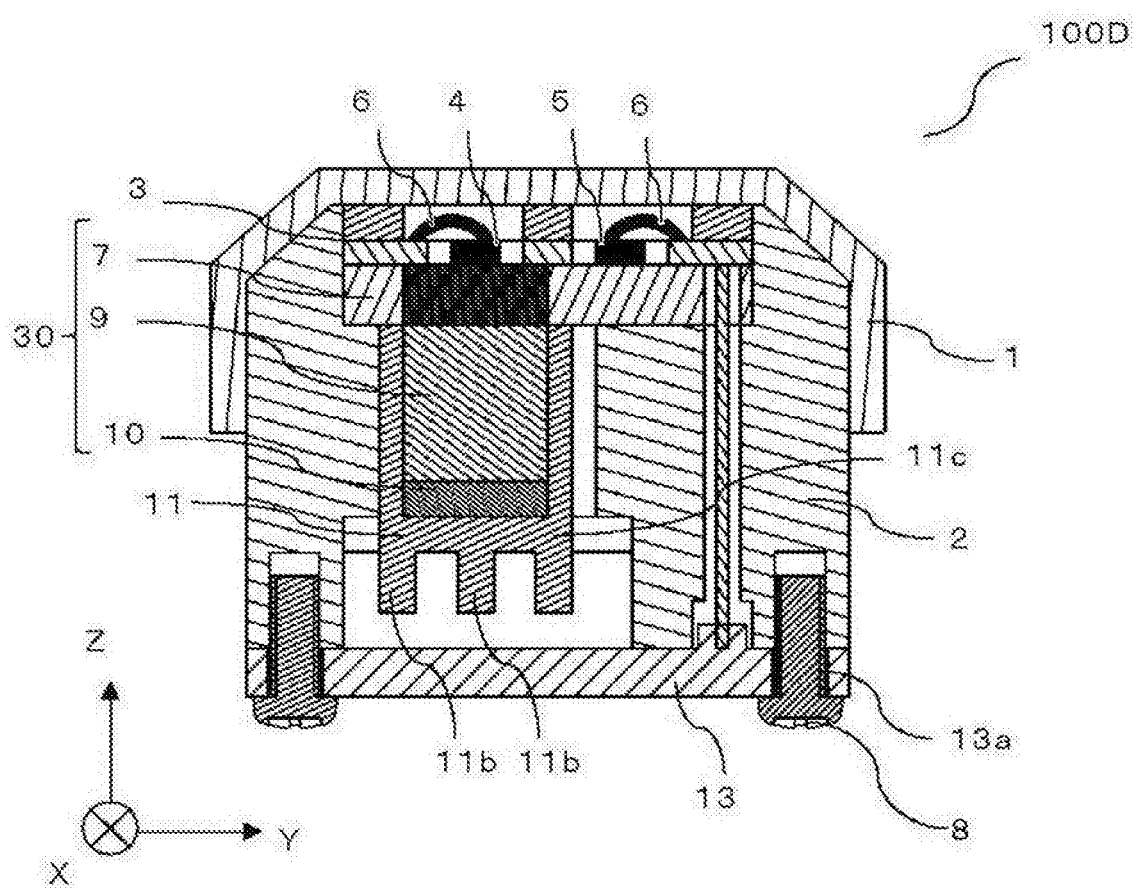
FIG. 18 is a cross-sectional drawing of the magnetic sensor device of Embodiment 5.

Configuration of a magnetic sensor device of Embodiment 5 of the present disclosure is described next using FIGS. 17 and 18. FIG. 17 is a perspective view of the heat dissipater of the magnetic sensor device of Embodiment 5. FIG. 18 is a cross-sectional drawing of the magnetic sensor device of Embodiment 5. In FIGS. 17 and 18, constituent elements that are the same or equivalent to those of FIG. 1 are assigned the same reference signs.

As illustrated in FIGS. 17 and 18, in the present Embodiment 5, the heat dissipater 11 of the magnetic sensor device 100D has a plate-shaped base 11c having fins 11b formed on the surface of the -Z side, and a pair of projections 11a (sidewalls) for determining the Y-direction positions of the magnet 9 and the yoke 10. The projections 11a are arranged projecting in the +Z direction from both Y-direction end portions of the base 11c of the heat dissipater 11.

As described above, in the present Embodiment 5, the heat dissipater 11 has the projections 11a. Thus the jig, which is necessary in the permanent magnet assembly step of the magnetic sensor device 100 of Embodiment 1 for fixing the magnet 9 and the yoke 10, can become unnecessary. Further, insertion of the magnet 9 and the yoke 10 between the projections 11a enables omission of the step in which the heat dissipater 11 is attached to the magnet 9 and the yoke 10. Moreover, contact surface area between the magnet 9 and the heat dissipater 11 increases due to contact of the +Y side and -Y side surfaces of the magnet 9 with the projections 11a. Heat radiation efficiency can be increased by this configuration.

Embodiment 6

Figure 19:
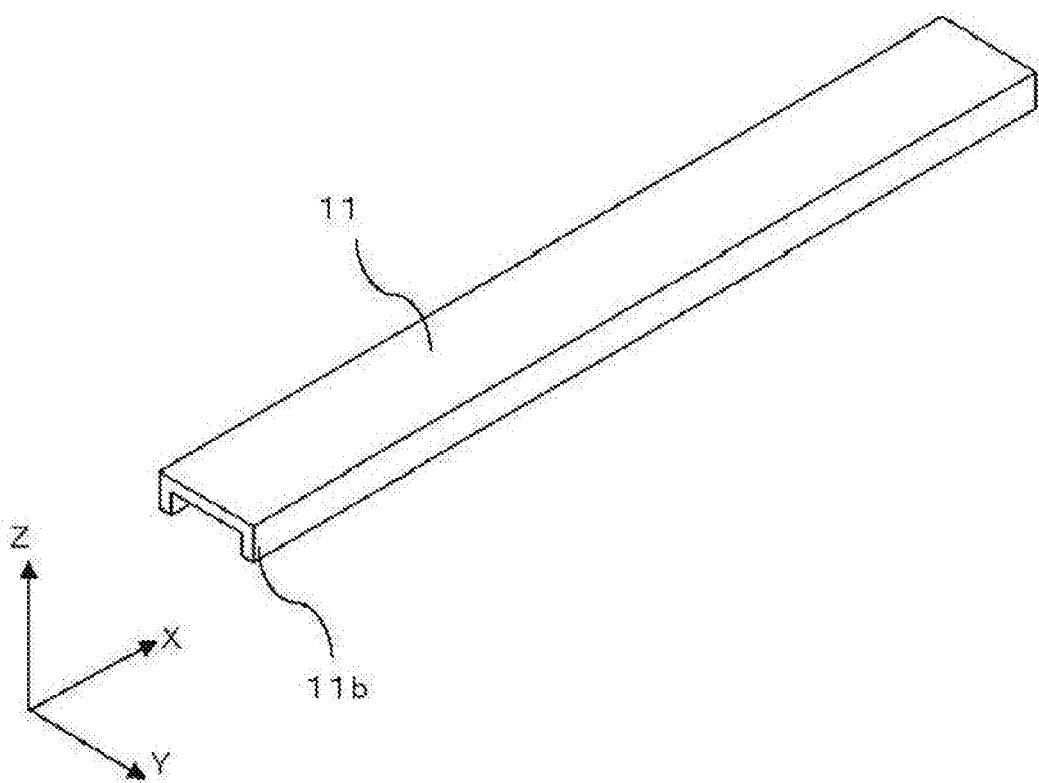
FIG. 19 is a perspective view of the heat dissipater of a magnetic sensor device of Embodiment 6 of this disclosure.
Figure 20:
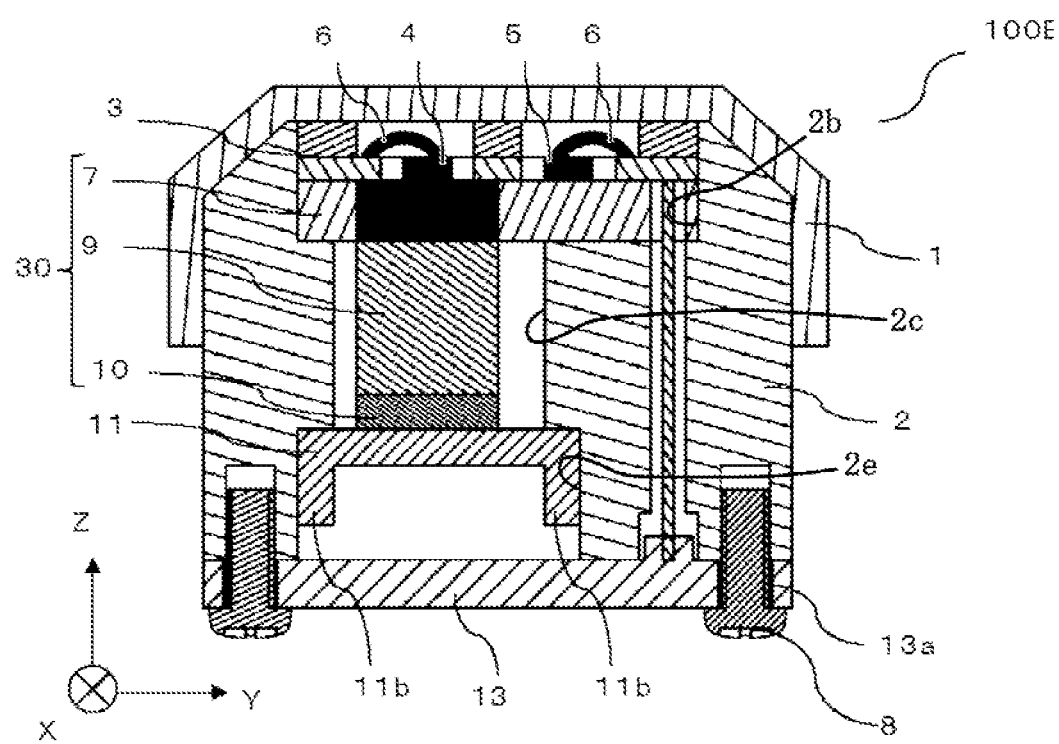
FIG. 20 is a cross-sectional drawing of the magnetic sensor device of Embodiment 6.

Configuration of a magnetic sensor device of Embodiment 6 of the present disclosure is described next using FIGS. 19 and 20. FIG. 19 is a perspective view of the heat dissipater of the magnetic sensor device of Embodiment 6. FIG. 20 is a cross-sectional drawing of the magnetic sensor device of Embodiment 6. In FIGS. 19 and 20, constituent elements that are the same or equivalent to those of FIG. 1 are assigned the same reference signs.

In Embodiment 6, the heat dissipater 11 is formed as a C-shaped channel that has: a plate-shaped base 11c for formation of fins 11b on the -Z side surface, and two of the fins 11b formed extending from the +Y side and -Y side end portions of the base 11c.

As described above, the heat dissipater 11 of the present Embodiment 6 has two fins 11b. Thus the shape of the heat dissipater 11 can be simplified, and fabrication cost of the heat dissipater 11 can be decreased.

The heat dissipater 11 of the magnetic sensor device 100 illustrated in Embodiment 1 generally is molded by extrusion molding due to the large number of fins 11b. In contrast, the present Embodiment 6 enables production by bending of sheet material and enables selection of a suitable production method. Moreover, setting the dimensions of the C-shaped channel to those of a standard product enables decrease of the fabrication cost.

Embodiment 7

Figure 21:
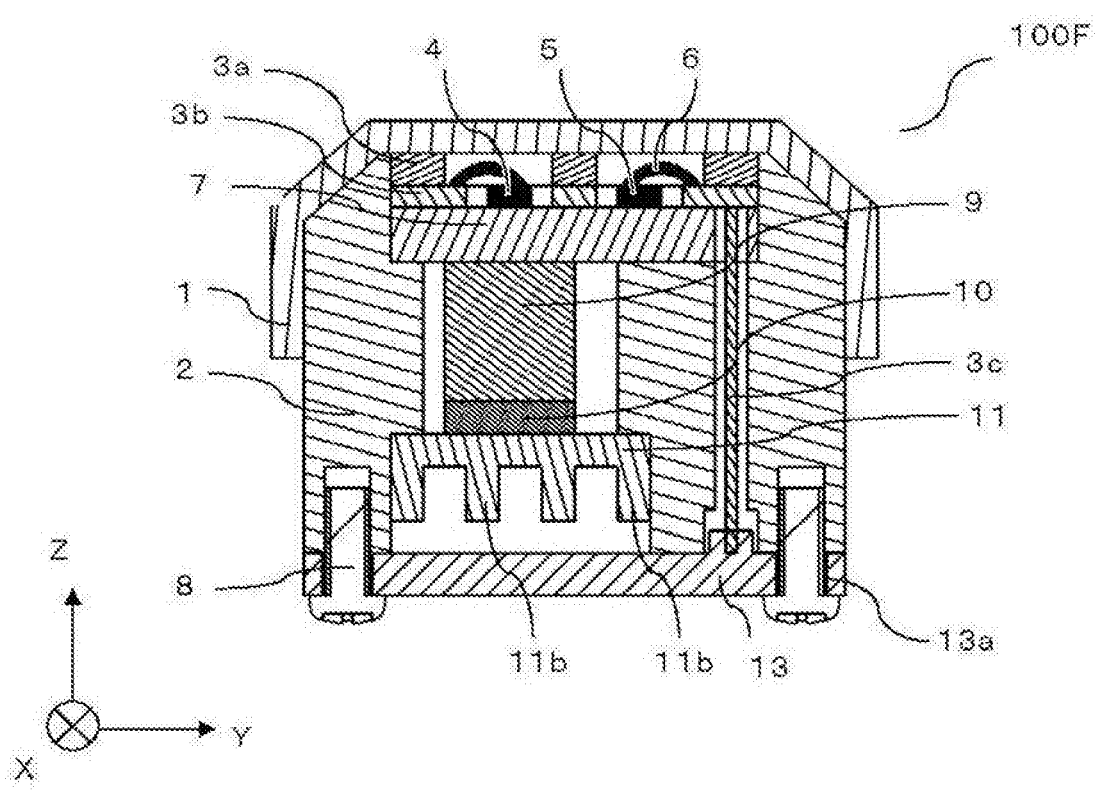
FIG. 21 is a cross-sectional drawing of a magnetic sensor device of Embodiment 7 of this disclosure.

Configuration of a magnetic sensor device of Embodiment 7 of the present disclosure is described next using FIG. 21. FIG. 21 is a cross-sectional drawing of the magnetic sensor device of Embodiment 7. The magnetic sensor device 100F enables detection only in the case in which the object to be detected 20 is magnetic. In FIG. 21, constituent elements that are the same or equivalent to those of FIG. 1 are assigned the same reference signs.

As illustrated in FIG. 21, in contrast to the metallic carrier 7 of the magnetic sensor device 100 of the present Embodiment 1, the metallic carrier 7 of the magnetic sensor device 100F is configured from a single sheet of non-magnetic plate. The magnetic carrier 7a has a role of arranging the direction of the magnetic field of the magnet 9 in the Z direction. However, in the case in which the object to be detected 20 is magnetized, the magnetic carrier 7a may be omitted from the metallic carrier 7. Heat dissipation efficiency can be improved due to the metallic carrier 7 in Embodiment 7 of the present disclosure not having the magnetic carrier 7a.

For example, in Embodiment 1 of the present disclosure and Embodiment 7 of the present disclosure, the magnetic carrier 7a is formed from iron (general heat transfer coefficient is 84 W/m·K), and the non-magnetic carrier 7b is formed from copper (general heat transfer coefficient is 398 W/m·K). Thus in Embodiment 7 of the present disclosure, heat dissipation efficiency can be increased due to formation of the metallic carrier 7 from only the non-magnetic carrier 7b, which has a high heat transfer coefficient.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2014-125159 including the specification, the claims, the figures and the abstract, filed on Jun. 18, 2014. The entire specification, claims, and drawings of Japanese Patent Application No. 2014-125159 are incorporated by reference herein.

REFERENCE SIGNS LIST

1 Cover
1a Taper
1b Conveyance surface
2 Case (housing)
2a Step
2b, 2c, 2e Hole
2f Board mounting surface
2g Board mounting hole
2h Offset surface
3 Sensor board
3a Non-conductive member
3b Conductive member
3c Cable
3d Positioning hole
3e, 3f Opening
4 Magnetoresistance effect element
5 Signal amplification IC (signal processor)
6 Wire
7 Metallic carrier
7a Magnetic carrier (magnetic body)
7b Non-magnetic carrier (non-magnetic body)
7c Positioning hole
7d Opening
8 Fastener
9 Magnet
10 Yoke
11 Heat dissipater
11a Projection (sidewall)
11b Fin
13 Signal processing board
13a Board mounting hole
20 Object to be detected
21 Conveyance direction
30 Magnetic circuit
100, 100A, 100B, 100C, 100D, 100E, 100F, 200 Magnetic sensor device

The invention claimed is:

1. A magnetic sensor device comprising:
a housing;
a magnetic circuit configured to form a magnetic field;
a magnetoresistance effect element, mounted on a first surface of the magnetic circuit on a conveyance path side of the magnetic circuit for an object to be detected by the magnetic sensor device, and configured to output a change of the magnetic field as a change of a resistance value; and
a heat dissipater having a first surface disposed in direct contact with a second surface of the magnetic circuit other than the first surface of the magnetic circuit on the conveyance path side of the magnetic circuit, the second surface of the magnetic circuit being opposite the first surface of the magnetic circuit, wherein
the magnetic circuit includes:
  a magnet having a first surface and a second surface opposite the first surface of the magnet,
  a metallic carrier defining the first surface of the magnetic circuit on the conveyance path side of the magnetic circuit, and having a second surface opposite the first surface of the magnetic circuit, wherein a first portion of the second surface of the metallic carrier is in direct contact with the first surface of the magnet, and
  a yoke having a first surface in direct contact with the second surface of the magnet, and defining the second surface of the magnetic circuit in direct contact with the heat dissipater, and
the metallic carrier includes:
  a magnetic body upon which is disposed the magnetoresistance effect element, and
  a non-magnetic body bonded to the magnetic body and carrying a signal processor electrically connected to the magnetoresistance effect element,
wherein the housing includes a first hole, a second hole, and a third hole formed continuously in a direction orthogonal to the first surface of the magnetic circuit on the conveyance path side of the magnetic circuit and orthogonal to a conveyance direction,
wherein the first hole contains the metallic carrier and includes a step for abutting a second portion of the second surface of the metallic carrier,
wherein the second hole contains the magnet and the yoke,
wherein the third hole contains the heat dissipater and includes a step for abutting the first surface of the heat dissipater when the heat dissipater, wherein the first and third holes are larger in length along the conveyance direction than the second hole.

2. The magnetic sensor device according to claim 1, wherein
the heat dissipater includes:
a base in the form of a plate, and
a pair of fins extending, in the direction orthogonal to the conveyance direction, away from the magnetic circuit and away from the base.

3. The magnetic sensor device according to claim 1, wherein
the magnet and the yoke are spaced from any surface of the housing that defines the third hole.

4. The magnetic sensor device according to claim 1, wherein the magnetic body and the non-magnetic body of the metallic carrier are arranged beside each other.

5. The magnetic sensor device according to claim 1, wherein
the heat dissipater consists of:
a base in the form of a plate, and
a pair of fins extending, in the direction orthogonal to the conveyance direction, away from the magnetic circuit and away from the base.

6. The magnetic sensor device as claimed in claim 1, further comprising:
a signal processing board; and
a cable for connecting the signal processing board to the signal processor.

* * * * *